(12) United States Patent
Saeki

(10) Patent No.: US 7,662,671 B2
(45) Date of Patent: Feb. 16, 2010

(54) SEMICONDUCTOR DEVICE AND METHOD FOR MANUFACTURING THE SAME

(75) Inventor: Yoshihiro Saeki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 222 days.

(21) Appl. No.: 11/531,702

(22) Filed: Sep. 14, 2006

(65) Prior Publication Data
US 2007/0072345 A1 Mar. 29, 2007

(30) Foreign Application Priority Data
Sep. 27, 2005 (JP) ............... 2005-279524

(51) Int. Cl.
*H01L 21/00* (2006.01)
(52) U.S. Cl. .................... 438/114; 438/462
(58) Field of Classification Search ......... 438/106–127, 438/459–465
See application file for complete search history.

(56) References Cited

U.S. PATENT DOCUMENTS

| | | | | |
|---|---|---|---|---|
| 5,099,309 A | * | 3/1992 | Kryzaniwsky | 361/718 |
| 5,482,887 A | * | 1/1996 | Duinkerken et al. | 438/458 |
| 5,817,986 A | * | 10/1998 | Davidson et al. | 174/250 |
| 6,504,241 B1 | * | 1/2003 | Yanagida | 257/686 |
| 6,670,206 B2 | * | 12/2003 | Kim et al. | 438/26 |
| 7,223,634 B2 | * | 5/2007 | Yamaguchi | 438/108 |
| 2002/0152610 A1 | * | 10/2002 | Nishiyama et al. | 29/840 |
| 2005/0202651 A1 | * | 9/2005 | Akram | 438/463 |
| 2006/0030127 A1 | * | 2/2006 | Fukasawa et al. | 438/460 |
| 2007/0120243 A1 | * | 5/2007 | Yanagisawa et al. | 257/686 |

FOREIGN PATENT DOCUMENTS

JP 2002-222901 A 8/2002

* cited by examiner

*Primary Examiner*—Savitri Mulpuri
(74) *Attorney, Agent, or Firm*—Rabin & Berdo, P.C.

(57) ABSTRACT

A method of manufacturing a semiconductor device is disclosed, which includes at least the steps of preparing a laminated structure including a single chip or a plurality of chips, and dividing the laminated structure into a plurality of sub-laminated structures. A laminated structure comprised of a silicon substrate and a single chip or a plurality of chips laminated on the silicon substrate is formed. Then, the laminated structure is divided into a plurality of sub-laminated structures. Each of the sub-laminated structures includes a semiconductor device.

4 Claims, 13 Drawing Sheets

SEMICONDUCTOR DEVICE AND METHOD FOR MANUFACTURING THE SAME

This application claims priority to Japanese Patent Application No. 2005-279524. The entire disclosure of Japanese Patent Application No. 2005-279524 and 2005-074356 are hereby incorporated herein by reference.

BACKGROUND OF THE INVENTION

Field of the Invention

The present invention relates to a semiconductor device and a method for manufacturing the same, and in particular, relates to a semiconductor device in which a plurality of semiconductor chips are laminated on a substrate in multilayers and a method for manufacturing the same.

In general, a semiconductor device is manufactured by sequentially performing the following steps: laminating a plurality of semiconductor chips on a substrate, sealing the semiconductor chips by a sealing resin, and forming external connecting terminals on the backside of the substrate. A plurality of semiconductor chips is generally laminated on the substrate in the bottom-up order. Therefore, the lamination step must be repeated the same number of times as the number of the laminated chips when a laminated structure is formed on the substrate. Japan Patent Application Publication JP-A-2002-222901 discloses a method for manufacturing a semiconductor device in which a ball pad is arranged on a substrate, and bumps are arranged on one surface of a chip and a chip ball pad is arranged on the other surface of the chip. A plurality of the chips are laminated on the substrate in multilayer in the bottom-up order. Then, a resin is filled in spaces between adjacent chips, a space between the bottom layer chip and the substrate, and lateral sides of the laminated structure comprised of a plurality of laminated chips. Finally, external terminals are connected on the backside of the substrate.

However, according to the conventional method for manufacturing a semiconductor device disclosed in Japan Patent Application Publication JP-A-2003-222901, a lamination step is required to be performed the same number of times as the number of the laminated chips. Therefore, as the number of laminated chips increases, the number of lamination steps increases. Accordingly, a problem occurs in which the period of time in which a manufacturing machine is used for the lamination steps is prolonged and thus the manufacturing cost is increased.

It is therefore an object of the present invention to provide a semiconductor device without the above described problem and a method for manufacturing the same.

SUMMARY OF THE INVENTION

According to the present invention, a method for manufacturing a semiconductor device is provided which comprises the steps of preparing a laminated structure including a single chip or a plurality of chips, and dividing the laminated structure into a plurality of sub-laminated structures.

In the present invention, the term "laminated structure" means a structure including a substrate and a single chip or a plurality of chips laminated on the substrate, or a structure including a plurality of laminated chips in multilayers without any substrate. The laminated structure may or may not include a resin, and may or may not include any other element such as a terminal used for the external connection. In addition, the term "chip laminated structure" means a structure comprised of a plurality of chips laminated on the substrate in multilayer. The chip laminated structure may or may not include a resin, and may or may not include any other element such as a terminal used for the external connection.

The laminated structure may be formed by laminating a plurality of chips on a substrate in multilayers in the bottom-up order. The method for dividing the structure is not limited to a specific method, and may be any type of method as long as it is available for dividing the structure.

According to the present invention, the structure comprised of a substrate and a single chip or a plurality of chips laminated on the substrate, or a structure comprised of a plurality of chips laminated in multilayers without any substrate, is formed. Then, the laminated structure is divided into a plurality of sub-laminated structures. Each of the sub-laminated structures comprises a semiconductor device. Even if a heretofore known lamination step is used, a plurality of semiconductor devices can be manufactured because the laminated structure formed by an available lamination method is divided into a plurality of sub-laminated structures by an available method. According to the conventional method for manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be manufactured through a series of lamination steps and a single division step or a plurality of subsequent division steps. In other words, it is possible to increase the number of semiconductor devices to be produced according to the number of sub-laminated structures produced by dividing the laminated structure through the same series of lamination steps.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

In the following explanation of the embodiments, a laminated structure means a structure including a substrate and at least a chip laminated on the substrate, or a structure including a plurality of chips laminated in multilayers without a substrate. In addition, a chip laminated structure means a structure comprised of a plurality of chips laminated on a substrate in multilayers.

First Embodiment

Figure 1:
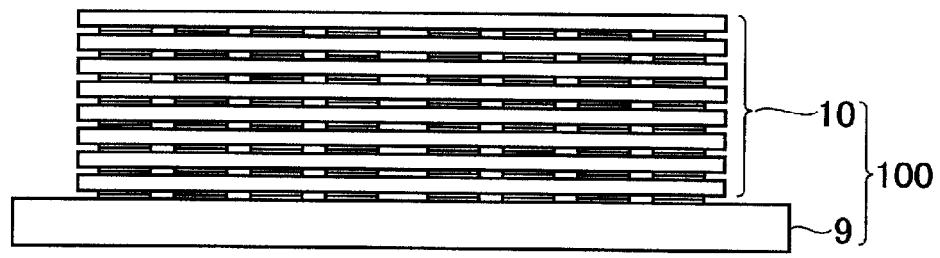
FIG. 1 is a lateral cross-section view of a laminated structure in a step of a method of manufacturing a semiconductor device in accordance with a first embodiment of the present invention.
Figure 2:
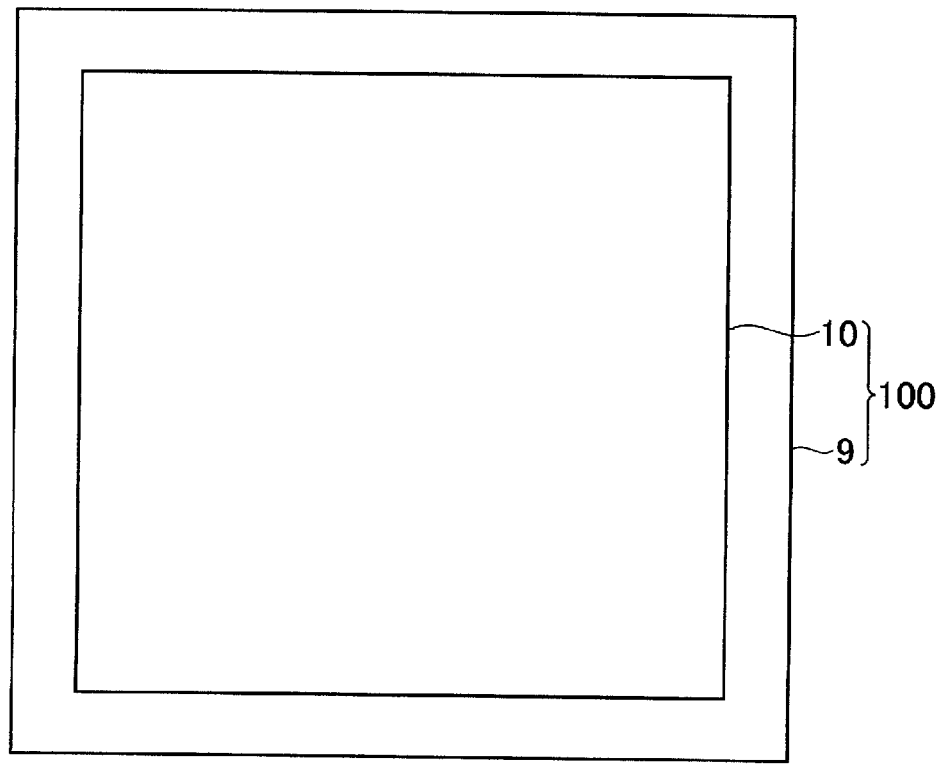
FIG. 2 is a top view of the laminated structure in the step shown in FIG. 1.
Figure 3:
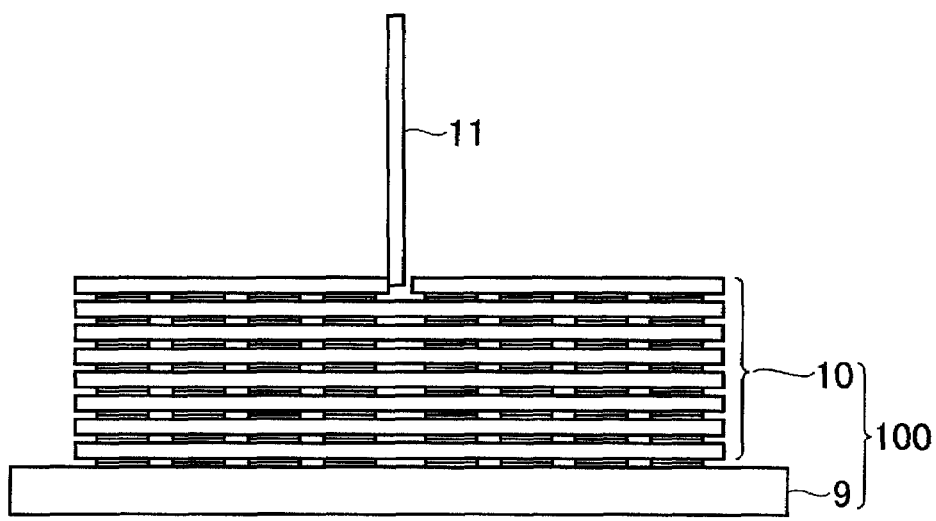
FIG. 3 is a lateral cross-section view of the laminated structure in the step of the method of manufacturing the semiconductor device in accordance with the first embodiment of the present invention and shows a state of the laminated structure before it is divided.
Figure 4:
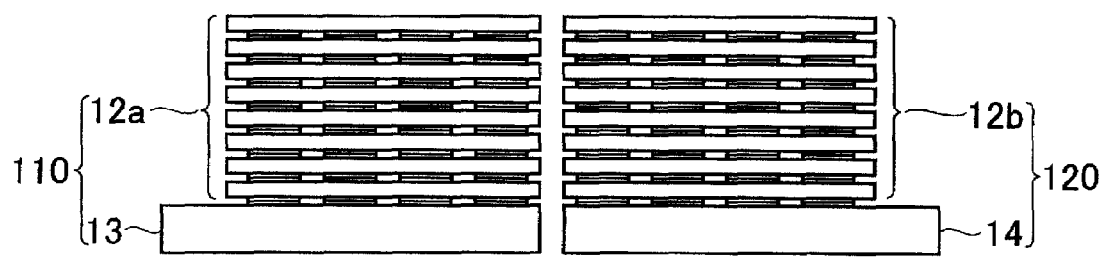
FIG. 4 is a lateral cross-section view of sub-laminated structure into which the laminated structure is divided in a step of the method of manufacturing the semiconductor device in accordance with the first embodiment of the present invention.
Figure 5:
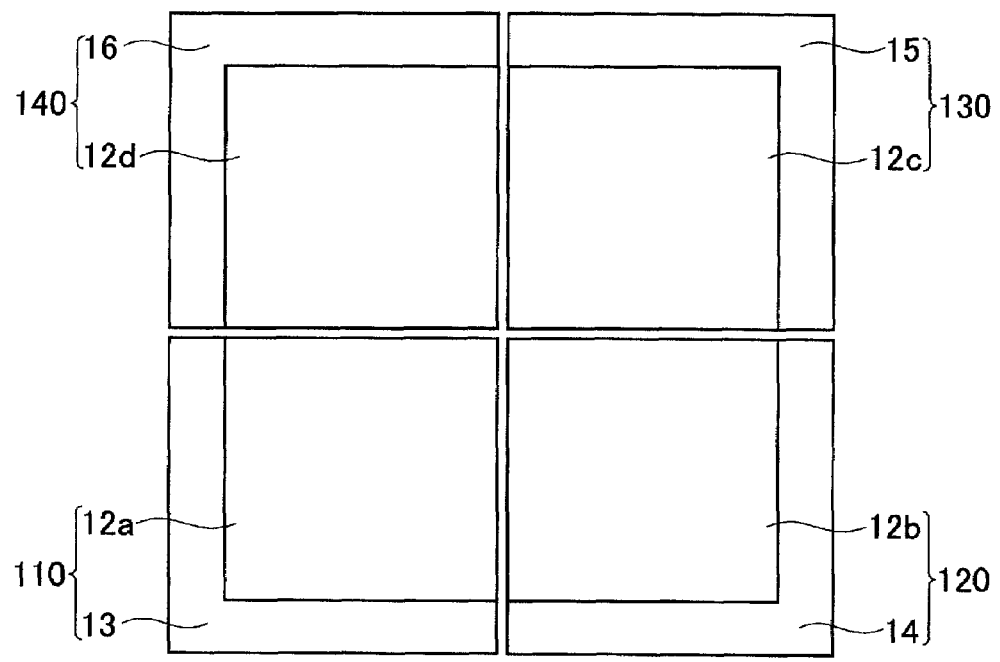
FIG. 5 is a top view of the sub-laminated structures shown in FIG. 4.
Figure 6:
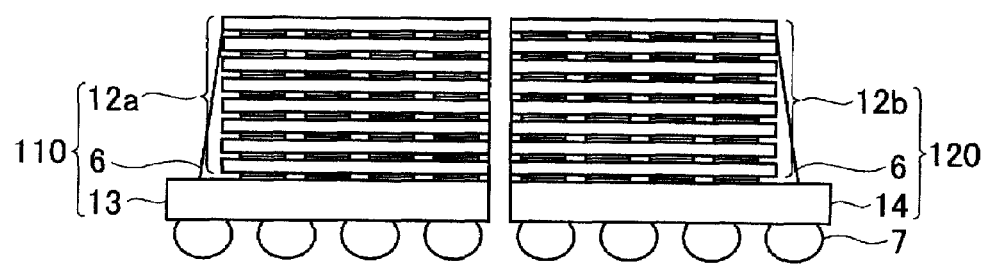
FIG. 6 is a lateral cross-section view of the laminated structure in a step of the method of manufacturing the semiconductor device in accordance with the first embodiment of the present invention.
Figure 7:
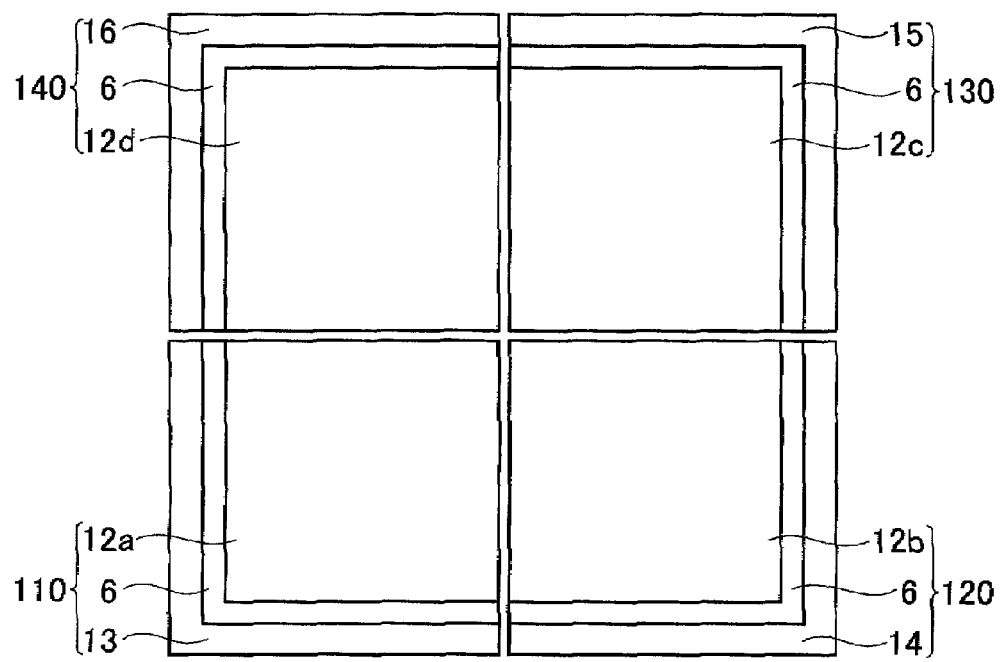
FIG. 7 is a top view of the laminated structure in the step shown in FIG. 6.

In a first embodiment of the present invention, a semiconductor device in which a plurality of chips laminated on a substrate in multilayers and a method for manufacturing the same will be described. FIG. 1 is a lateral cross-section view of a laminated structure in a step of a method of manufacturing a semiconductor device in accordance with the first embodiment of the present invention. FIG. 2 is a top view of the laminated structure in the step shown in FIG. 1. FIG. 3 is a lateral cross-section view of the laminated structure in a step of the method of manufacturing the semiconductor device in accordance with the first embodiment of the present invention, and shows a state of the laminated structure before it is divided. FIG. 4 is a lateral cross-section view of sub-laminated structures into which the laminated structure is divided in a step of the method of manufacturing the semiconductor device in accordance with the first embodiment of the present invention. FIG. 5 is a top view of the sub-laminated structures shown in FIG. 4. FIG. 6 is a lateral cross-section view of the laminated structure in a step of the method of manufacturing the semiconductor device in accordance with the first embodiment of the present invention. FIG. 7 is a top view of the laminated structure in the step shown in FIG. 6.

Manufacturing Process

As shown in FIGS. 1 and 2, a silicon substrate 9 is prepared for laminating semiconductor chips in multilayers. The implementation surface dimension of the silicon substrate 9 is more than the upper/lower surface dimension of each of the semiconductor chips to be laminated on the silicon substrate 9. The upper/lower surface dimension of each of the semiconductor chips corresponds to the total upper/lower surface dimensions of the four sub semiconductor chips (hereinafter referred to as "sub semiconductor chips" or simply "sub-chips"), each of which comprised in a final intended semiconductor device. Then, a chip laminated structure 10 is formed on the silicon substrate 9. The chip laminated structure 10 is eight-layer chip laminated structure and comprised of eight semiconductor chips, each of which has the four-chip dimension. The eight-layer chip laminated structure 10 can be formed by a heretofore known conventional method, and the forming method thereof is not limited to a specific method. For example, ball pads are arranged on the implementation surface of the silicon substrate 9. On the other hand, bumps are arranged on one surface of the semiconductor chip, and chip ball pads are arranged on the other surface of the semiconductor chip. Eight semiconductor chips may be laminated on the semiconductor substrate 9 in eight layers in the bottom-up order. Alternatively, a new method for laminating semiconductor chips may be performed which was proposed by the inventor of the present invention and disclosed in Japanese Patent Application Publication JP-A-2005-074356. The new method reduces the maximum number of chip lamination steps that the bottom layer chip undergoes until the completion of laminating semiconductor chips on a substrate, compared to a method for laminating a plurality of semiconductor chips on the silicon substrate 9 in multilayers in the bottom-up order. In other words, the above described preparation step of the laminated structure may include at least a step of laminating a first chip sub-block that is comprised of a plurality of laminated chips and a second chip sub-block that is comprised of a plurality of laminated chips. As the other option, the above described preparation step of the laminated structure may include a step of laminating a first chip on a substrate, a step of forming a first chip sub-block by laminating a second chip and a third chip, and a step of laminating the first chip sub-block on the first chip laminated on the substrate. For example, the following is an example of a method for laminating eight chips on a substrate in eight layers. First, eight chips are prepared and paired. The paired chips of the four pairs of chips are laminated with each other, and thus, four two-chip sub blocks are formed. Then, the four two-chip sub-blocks are paired, and the paired two-chip sub-blocks of four pairs of two-chip sub-blocks are laminated with each other. Thus, two four-chip sub-blocks are formed. Furthermore, the two four-chip sub-blocks are paired and laminated with each other. Thus, an eight-chip laminated structure is formed. Finally, the eight-chip laminated structure 10 is implemented on the substrate 9.

Furthermore, each of the lamination steps may be performed by any type of method as long as it is performed by connecting the chip ball pads and the bumps by the application of weight, heat, ultrasonic, and the other kinds of energy, and is not limited to a specific method.

Next, as shown in FIGS. 3 to 5, division steps are performed for dividing the laminated structure 100 comprised of the silicon substrate 9 and the chip laminated structure 10 implemented on the silicon substrate 9 into four sub-laminated structures (i.e., a first to fourth sub-laminated structures 110, 120, 130, and 140). The division steps can be realized by any available division method. As a typical example of the available division method, the thermal cutting with laser irradiation, and the mechanical cutting with a dicing blade can be suggested. An example of division steps that are performed by the cutting with a dicing blade will be hereinafter explained in detail. The laminated structure 100 is cut downward from the top layer chip comprising the chip laminated structure 10 to the silicon substrate 9 by a dicing blade 11. The cutting is performed for the laminated structure 100 shown in FIG. 2 by the dicing blade 11 twice. More specifically, the laminated structure 100 is cut in two directions, perpendicular to each other. Thus, as shown in FIGS. 4 and 5, the laminated structure 100 is divided into four sub-laminated structures (i.e., the first to fourth sub-laminated structures 110, 120, 130, and 140). In other words, the chip laminated structure 10 is divided into four sub-chip laminated structures (i.e., first to fourth sub-chip laminated structures 12a, 12b, 12c, and 12d). At the same time as this, the silicon substrate 9 is divided into four sub-silicon substrates (i.e., first to fourth sub-silicon substrates 13, 14, 15, and 16). As a result, the laminated structure 100 that is comprised of the silicon substrate 9 and the chip laminated structure 10 is divided into (i) the first sub-laminated structure 110 that is comprised of the first sub-silicon substrate 13 and the first sub-chip laminated structure 12a, (ii) the second sub-laminated structure 120 that is comprised of the second sub-silicon substrate 14 and the second sub-chip laminated structure 12b, (iii) the third sub-laminated structure 130 that is comprised of the third sub-silicon substrate 15 and the third sub-chip laminated structure 12c, and (iv) the fourth sub-laminated structure 140 that is comprised of the fourth sub-silicon substrate 16 and the fourth sub-chip laminated structure 12d. The first to fourth sub-laminated structures 110, 120, 130, and 140, respectively, can comprise a semiconductor device. Next, a heretofore known resin sealing step, an external connecting terminal forming step, and a packaging step are further performed if required.

In the first embodiment of the present invention, the division steps are performed after the above described lamination steps. Thus, four semiconductor devices can be produced. In the first embodiment of the present invention, a plurality of semiconductor devices can be produced even if the conventional lamination step is performed. According to the conventional method of manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be produced through a series of lamination steps and the subsequent division steps. In other words, it is possible to increase the number of semiconductor devices to be produced according to the number of sub-laminated structures produced by dividing the laminated structure through the same series of lamination steps. That is to say, if the same number of semiconductor devices are to be produced through the same lamination method, the required total number of lamination steps can be reduced by a single division step or a plurality of the division steps in accordance with the present invention. Reduction of the required total number of lamination steps makes it possible to reduce the amount of time that the lamination device is used for the lamination steps, and makes it possible to further reduce the manufacturing cost.

Semiconductor Device Structure

As shown in FIGS. 4 and 5, the first to fourth sub-laminated structures 110, 120, 130, and 140, respectively, has four lateral sides. Two of them are comprised of cutting surfaces defined by cutting the laminated structure 100 by the dicing blade 11 in the above described division steps. The rest of them are comprised of non-cutting surfaces. The two non-cutting surfaces of each of the first to fourth sub-laminated structures 110, 120, 130, and 140 are comprised of the non-cutting surfaces of each of the first to fourth sub-silicon substrates 13, 14, 15, and 16, and the non-cutting surface of each of the first to fourth sub-chip laminated structures 12a, 12b, 12c, and 12d. As shown in FIG. 5, the non-cutting surface of each of the first to fourth sub-chip laminated structures 12a, 12b, 12c, and 12d is clearly positioned inward from the non-cutting surface of each of the first to fourth sub-silicon substrates 13, 14, 15, and 16 in the direction perpendicular to the non-cutting surface. On the other hand, two cutting surfaces of each of the first to fourth sub-laminated structures 110, 120, 130, and 140 are comprised of the cutting surface of each of the first to fourth sub-silicon substrates 13, 14, 15, and 16, and the cutting surface of each of the first to fourth sub-chip laminated structures 12*a*, 12*b*, 12*c*, and 12*d*. As shown in FIG. 5, the cutting surface of each of the first to fourth sub-chip laminated structures 12*a*, 12*b*, 12*c*, and 12*d* is clearly aligned with the cutting surface of each of the first to fourth sub-silicon substrates 13, 14, 15, and 16 in the direction perpendicular to the cutting surface.

As shown in FIGS. 6 and 7, a liquid resin is injected by a dispenser into spaces between adjacent chips in the first to fourth sub-chip laminated structures 12*a*, 12*b*, 12*c*, and 12*d*, spaces between the bottom layer chip in each of the first to fourth sub-chip laminated structures 12*a*, 12*b*, 12*c*, and 12*d* and each of the first to fourth sub-silicon substrate 13, 14, 15, and 16, and lateral sides of the first to fourth sub-chip laminated structures 12*a*, 12*b*, 12*c*, and 12*d*. Thus, a sealing resin 6 for sealing the chips is formed. In this configuration, a heretofore known liquid resin is used for sealing the chips. For example, a nonconductive paste (NCP) resin or an anisotropic conductive paste (ACP) resin can be used. The distance between the adjacent chips is approximately 10 to 20 μm, for instance. Therefore, it is possible to inject the sealing resin into the spaces with capillary phenomenon. The laminated structure 100 is comprised of the silicon substrate 9, the chip laminated structure 10, and the sealing resin 6.

Alternative Example

Note that the laminated structure 100 is divided into four sub-laminated structures (i.e., the first to fourth sub-laminated structures 110, 120, 130, and 140 in the first embodiment of the present invention), but the number of the sub-laminated structures is not limited to a specific number as long as it is two or greater. For example, according to the present invention, it is possible to produce more semiconductor devices even if the conventional lamination steps are used, compared to the conventional method, if a division of 2×1, 2×2, 2×3, 3×1, 3×3, 3×4, 4×4, 4×5, 5×1, 5×2, 5×3, 5×5 . . . or 10×10 is performed.

Furthermore, in the first embodiment of the present invention, eight semiconductor chips are laminated on the silicon substrate 9 in eight layers. However, the number of laminated semiconductor chips is not limited to eight as long as at least a semiconductor chip is implemented on the silicon substrate 9. In short, the division step of the present invention may be any type of step as long as the laminated structure is divided into a plurality of sub-laminated structures. The laminated structure may or may not include a resin, and may or may not include any other element such as a terminal that is used for the external connection. For example, the same effect of the present invention can be obtained even if a laminated structure comprised of a substrate and a semiconductor chip implemented on the substrate is divided into a plurality of sub-laminated structures in a single lamination step or a plurality of lamination steps of the present invention. In addition, the same effect of the present invention can be obtained even if a chip laminated structure comprised of a plurality of semiconductor chips without a substrate is divided into a plurality of sub-laminated structures in a single division step or a plurality of division steps of the present invention. The chip laminated structure may or may not include a resin, and may or may not include any other element such as a terminal that is used for the external connection.

Furthermore, a step of forming external terminals on the silicon substrate 9 may or may not be performed. If the step of forming the external terminal on the silicon substrate 9 is performed, it may be performed before the lamination steps, or before the division steps and after the lamination steps, or after the division steps.

Furthermore, instead of connecting the external terminal on the silicon substrate 9 directly, it is possible to use a chip having an external connection function by the wafer-level chip size package (W-CSP) technology as the silicon substrate 9.

Furthermore, it is possible to form the laminate structure 100 by laminating at least a semiconductor chip on a substrate other than a semiconductor substrate, such as an organic substrate (e.g., a glass epoxy substrate), a polyimide tape substrate, and a ceramic substrate, instead of the silicon substrate 9, and then form a plurality of sub-laminated structures by dividing the laminated structure through a single division step or plurality of the division steps of the present invention.

As described above, the bumps are arranged on one surface of each of the semiconductor chips, and the semiconductor chips may be implemented on the semiconductor substrate 9 so that the surface thereof on which the bumps are arranged faces downward. However, the semiconductor chips may be implemented on the semiconductor substrate 9 so that the surface thereof on which the bumps are arranged faces upward. Furthermore, the bumps may be arranged on both surfaces of each of the semiconductor chips, and the semiconductor chips may be implemented on the semiconductor substrate.

According to the conventional method of manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be produced through a series of lamination steps and the subsequent division steps. In other words, it is possible to increase the number of semiconductor devices to be produced according to the number of sub-laminated structures produced by dividing the laminated structure through the same series of lamination steps. That is to say, if the same number of semiconductor devices are to be produced through the same lamination method, the required total number of lamination steps can be reduced by a single division step or a plurality of the division steps in accordance with the present invention. Reduction of the required total number of lamination steps makes it possible to reduce the amount of time that the lamination device is used for the lamination steps, and makes it possible to further reduce the manufacturing cost.

The following second to fourth embodiments of the present invention will now be described by focusing the differences with the above described first embodiment of the present invention. In view of the similarity between the first and the second to fourth embodiments, the parts of the second to fourth embodiments that are identical to the parts of the first embodiment will be given the same reference numerals as parts of the first embodiment. Moreover, the descriptions of the parts of the second to fourth embodiments that are identical to the parts of the first embodiment may be omitted for the sake of brevity.

Second Embodiment

Figure 8:
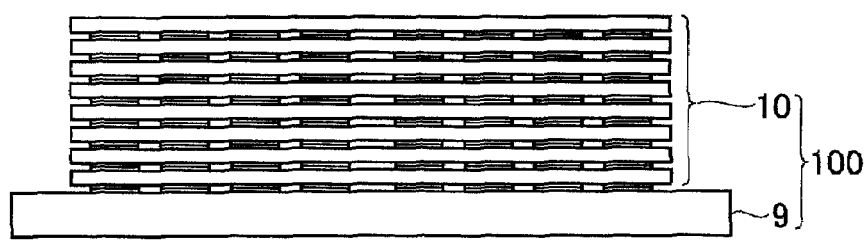
FIG. 8 is a lateral cross-section view of the laminated structure in a step of the method of manufacturing the semiconductor device in accordance with a second embodiment of the present invention.
Figure 9:
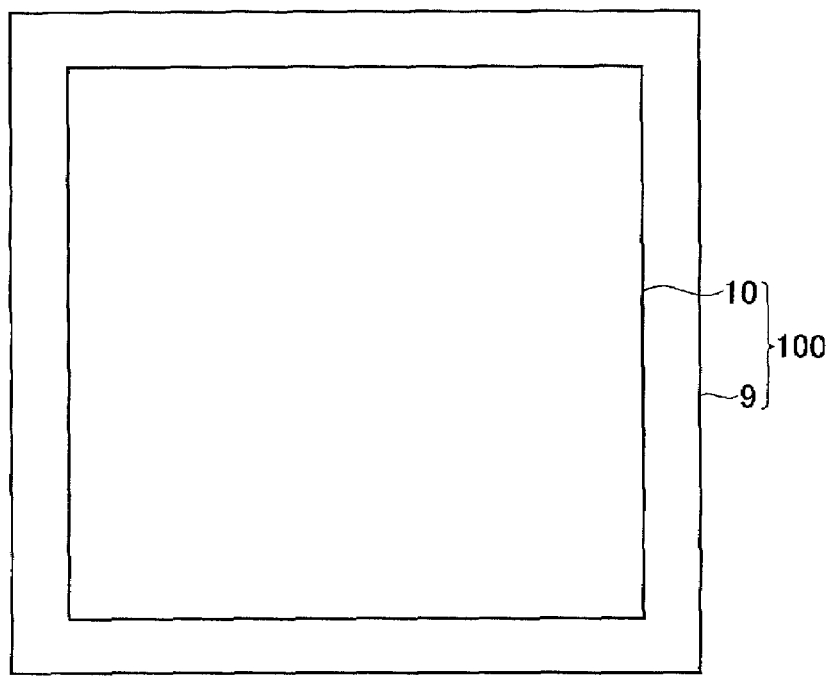
FIG. 9 is a top view of the laminated structure in the step shown in FIG. 8.
Figure 10:
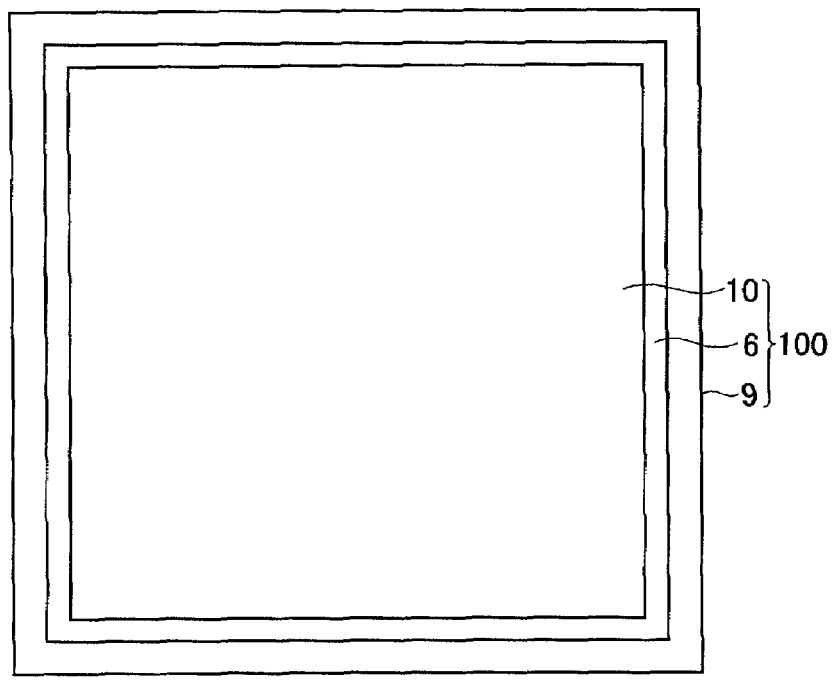
FIG. 10 is a top view of the laminated structure in a step of the method of manufacturing a semiconductor device in accordance with the second embodiment of the present invention.
Figure 11:
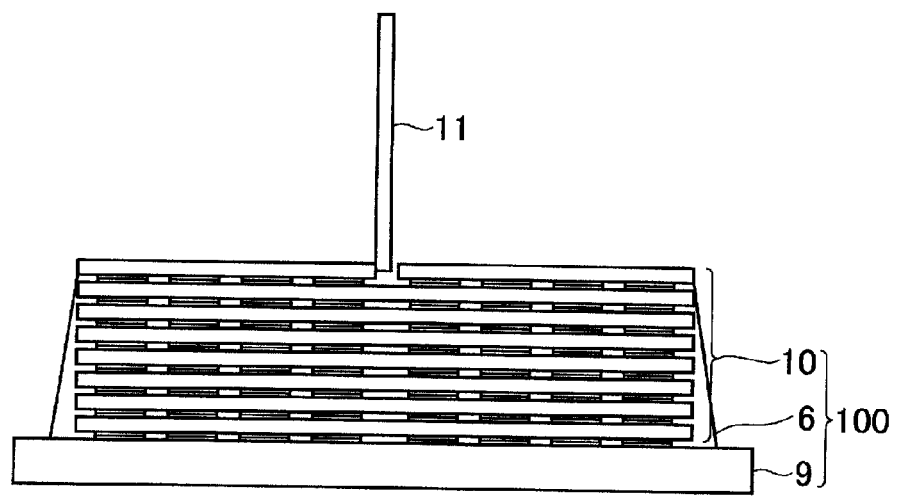
FIG. 11 is a lateral cross-section view of the laminated structure in the step of the method of manufacturing the semiconductor device in accordance with the second embodiment of the present invention and shows a state of the laminated structure before it is divided.
Figure 12:
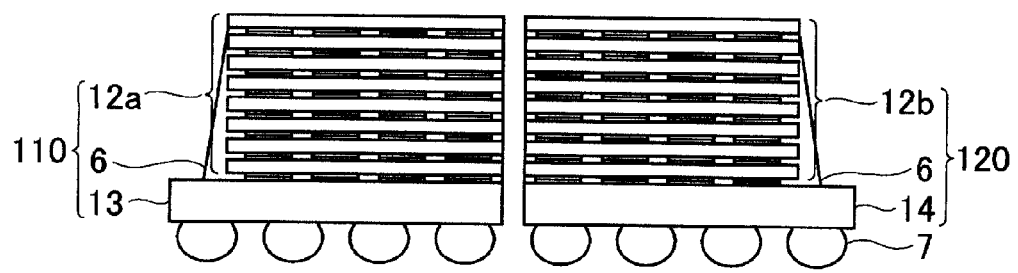
FIG. 12 is a lateral cross-section view of sub-laminated structure into which the laminated structure is divided in a step of the method of manufacturing the semiconductor device in accordance with the second embodiment of the present invention.
Figure 13:
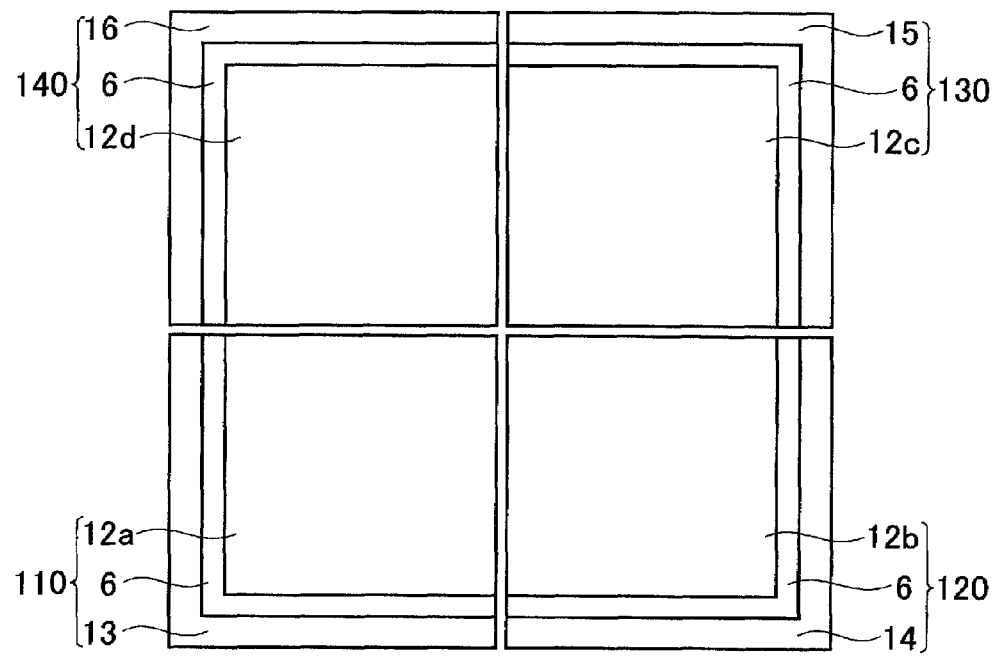
FIG. 13 is a top view of the sub-laminated structures shown in FIG. 12.

In a second embodiment of the present invention, a semiconductor device in which a plurality of chips laminated on a substrate in multilayers and a method for manufacturing the same will be described. FIG. 8 is a lateral cross-section view of the laminated structure in a step of the method of manufacturing the semiconductor device in accordance with the second embodiment of the present invention. FIG. 9 is a top view of the laminated structure in the step shown in FIG. 8. FIG. 10 is a top view of the laminated structure in a step of the method of manufacturing the semiconductor device in accordance with the second embodiment of the present invention. FIG. 11 is a lateral cross-section view of the laminated structure in a step of the method of manufacturing the semiconductor device in accordance with the second embodiment of the present invention, and shows a state of the laminated structure before it is divided. FIG. 12 is a lateral cross-section view of sub-laminated structures into which the laminated structure is divided in a step of the method of manufacturing the semiconductor device in accordance with the second embodiment of the present invention. FIG. 13 is a top view of the sub-laminated structures shown in FIG. 12.

Manufacturing Process

As shown in FIGS. 8 and 9, a silicon substrate 9 is prepared for laminating semiconductor chips in multilayers. The implementation surface dimension of the silicon substrate 9 is more than the upper/lower surface dimension of each of the semiconductor chips to be laminated on the silicon substrate 9. The upper/lower surface dimension of each of the semiconductor chips corresponds to the total upper/lower surface dimensions of the four sub semiconductor chips (hereinafter referred to as "sub semiconductor chips" or simply "sub-chips), each of which comprised in a final intended semiconductor device. Then, a chip laminated structure 10 is formed on the silicon substrate 9. The chip laminated structure 10 has an eight-layer chip laminated structure and comprised of eight semiconductor chips, each of which has the four-chip dimension. The eight-layer chip laminated structure 10 can be formed by a heretofore known conventional method, and the forming method thereof is not limited to a specific method. For example, ball pads are arranged on the implementation surface of the silicon substrate 9. On the other hand, bumps are arranged on one surface of the semiconductor chip, and chip ball pads are arranged on the other surface of the semiconductor chip. Eight semiconductor chips may be laminated on the semiconductor substrate 9 in eight layers in the bottom-up order. Alternatively, as described in the first embodiment of the present invention, the new method for laminating semiconductor chips may be performed which was proposed by the inventor of the present invention and disclosed in Japanese Patent Application Publication JP-A-2005-074356.

Furthermore, each of the lamination steps may be performed by any type of method as long as it is performed by connecting the chip ball pads and the bumps by the application of weight, heat, ultrasonic, and the other kinds of energy, and is not limited to a specific method.

As shown in FIGS. 10 and 11, a liquid resin is injected by a dispenser into spaces between adjacent chips in the chip laminated structure 10, a space between the bottom layer chip in the chip laminated structure 10 and the substrate 9, and on the lateral sides of the chip laminated structure 10. Thus, a sealing resin 6 for sealing the chips is formed. In this configuration, a heretofore known liquid resin is used for sealing the chips. For example, a nonconductive paste (NCP) resin or an anisotropic conductive paste (ACP) resin can be used. The distance between the adjacent chips is approximately 10 to 20 μm, for instance. Therefore, it is possible to inject the sealing resin into the spaces with capillary phenomenon. The laminated structure 100 is comprised of the silicon substrate 9, the chip laminated structure 10, and the sealing resin 6.

Next, as shown in FIGS. 11 to 13, division steps are performed for dividing the laminated structure 100 comprised of the silicon substrate 9 and the chip laminated structure 10 implemented on the silicon substrate 9 into four sub-laminated structures (i.e., a first to fourth sub-laminated structures 110, 120, 130, and 140). The division steps can be realized by any available division method. As a typical example of the available division method, the thermal cutting with laser irradiation, and the mechanical cutting with a dicing blade can be suggested. An example of division steps that are performed by the cutting with a dicing blade will be hereinafter explained in detail. The laminated structure 100 is cut downward from the top layer chip comprising the chip laminated structure 10 to the silicon substrate 9 by a dicing blade 11. The cutting is performed for the laminated structure 100 shown in FIGS. 10 and 11 by the dicing blade 11 twice. More specifically, the laminated structure 100 is cut in two directions, perpendicular to each other. Thus, as shown in FIGS. 12 and 13, the laminated structure 100 is divided into four sub-laminated structures (i.e., the first to fourth sub-laminated structures 110, 120, 130, and 140). The sealing resin 6 injected in the spaces between adjacent chips and the space between the bottom layer chip and the silicon substrate 9 effectively serves to prevent the chips from being chipped and cracked, prevent cutting scrap from getting into the spaces between adjacent chips, and prevent water from getting into the spaces between adjacent chips when the chip laminated structure 10 is cut by the dicing blade 11.

In other words, the chip laminated structure 10 is divided into four sub-chip laminated structures (i.e., first to fourth sub-chip laminated structures 12a, 12b, 12c, and 12d). At the same time as this, the silicon substrate 9 is divided into four sub-silicon substrates (i.e., first to fourth sub-silicon substrates 13, 14, 15, and 16). As a result, the laminated structure 100 that is comprised of the silicon substrate 9 and the chip laminated structure 10 is divided into (i) the first sub-laminated structure 110 that is comprised of the first sub-silicon substrate 13 and the first sub-chip laminated structure 12a, (ii) the second sub-laminated structure 120 that is comprised of the second sub-silicon substrate 14 and the second sub-chip laminated structure 12b, (iii) the third sub-laminated structure 130 that is comprised of the third sub-silicon substrate 15 and the third sub-chip laminated structure 12c, and (iv) the fourth sub-laminated structure 140 that is comprised of the fourth sub-silicon substrate 16 and the fourth sub-chip laminated structure 12d. The first to fourth sub-laminated structures 110, 120, 130, and 140, respectively, can comprise a semiconductor device. Then, external terminals 7 are formed on the backside of the first to fourth sub-silicon substrates 13, 14, 15, and 16.

In the second embodiment of the present invention, the division steps are performed after the above described lamination steps. Thus, four semiconductor devices can be produced. According to the conventional method of manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be produced through a series of lamination steps and the subsequent division steps. In other words, it is possible to increase the number of semiconductor devices to be produced according to the number of sub-laminated structures produced by dividing the laminated structure through the same series of lamination steps. That is to say, if the same number of semiconductor devices is to be produced through the same lamination method, the required total number of lamination steps can be reduced by a single division step or a plurality of the division steps in accordance with the present invention. Reduction of the required total number of lamination steps makes it possible to reduce the amount of time that the lamination device is used for the lamination steps, and makes it possible to further reduce the manufacturing cost.

Semiconductor Device Structure

As shown in FIGS. 12 and 13, the first to fourth sub-laminated structures 110, 120, 130, and 140, respectively, has four lateral sides. Two of them are comprised of cutting surfaces defined by cutting the laminated structure 100 by the dicing blade 11 in the above described division steps. The rest of them are comprised of non-cutting surfaces. The two non-cutting surfaces of each of the first to fourth sub-laminated structures 110, 120, 130, and 140 are comprised of the non-cutting surfaces of each of the first to fourth sub-silicon substrates 13, 14, 15, and 16, and fillet portions of the sealing resin 6 that cover the non-cutting surface of each of the first to fourth sub-chip laminated structures 12a, 12b, 12c, and 12d. As shown in FIG. 13, the non-cutting surface of each of the first to fourth sub-chip laminated structures 12a, 12b, 12c, and 12d is clearly positioned inward from the non-cutting surface of each of the first to fourth sub-silicon substrates 13, 14, 15, and 16 in the direction perpendicular to the non-cutting surface. Furthermore, the fillet portions of the sealing resin 6 that cover the first to fourth sub-chip laminated structures 12a, 12b, 12c, and 12d are also positioned inward from the non-cutting surface of each of the first to fourth sub-silicon substrates 13, 14, 15, and 16 in the direction perpendicular to the non-cutting surface. On the other hand, two cutting surfaces of each of the first to fourth sub-laminated structures 110, 120, 130, and 140 are comprised of the cutting surface of each of the first to fourth sub-silicon substrates 13, 14, 15, and 16, the cutting surface of each of the first to fourth sub-chip laminated structures 12a, 12b, 12c, and 12d, and the cutting surface of the sealing resin 6 that is injected into the spaces between adjacent chips, the space between the bottom layer chip and the silicon substrate 9. As shown in FIG. 13, the cutting surface of each of the first to fourth sub-chip laminated structures 12a, 12b, 12c, and 12d is clearly aligned with the cutting surface of each of the first to fourth sub-silicon substrates 13, 14, 15, and 16 and the cutting surface of the sealing resin 6 in the direction perpendicular to the cutting surface.

Alternative Example

Note that the laminated structure 100 is divided into four sub-laminated structures (i.e., the first to fourth sub-laminated structures 110, 120, 130, and 140 in the second embodiment of the present invention), but the number of the sub-laminated structures is not limited to a specific number as long as it is two or greater. For example, according to the present invention, it is possible to produce more semiconductor devices even if the conventional lamination steps are used, compared to the conventional method, if a division of 2×1, 2×2, 2×3, 3×1, 3×3, 3×4, 4×4, 4×5, 5×1, 5×2, 5×3, 5×5 . . . or 10×10 is performed.

In the second embodiment of the present invention, the forming step of the sealing resin 6 comprised of a liquid resin is performed after the completion of the forming steps of the chip laminated structure 10. However, the liquid resin may be applied on one surface of each of the chips before each of the chips is laminated, and then the chips may be laminated so that the liquid resin is interposed between the chips. In this configuration, for example, the liquid resin is applied to at least either the upper surface of the silicon substrate 9 or the lower surface of the bottom layer chip, and then the bottom layer chip is laminated on the silicon substrate 9. Furthermore, the liquid resin is applied to at least either the upper surface of the bottom layer chip or the lower surface of the second layer chip to be laminated on the bottom layer chip, and then the second layer chip is laminated on the bottom layer chip. The chip laminated structure 10 may be formed by repeating the above described steps. Furthermore, it is possible to laminate chips by interposing an insulator film between adjacent chips. For example, a nonconductive paste (NCP) or an anisotropic conductive paste (ACP) can be used as the insulator film.

Furthermore, in the second embodiment of the present invention, eight semiconductor chips are laminated on the silicon substrate 9 in eight layers. However, the number of laminated semiconductor chip is not limited to eight as long as at least a semiconductor chip is implemented on the silicon substrate 9. In short, the division step of the present invention may be any type of step as long as the laminated structure is divided into a plurality of sub-laminated structures. The laminated structure may or may not include a resin, and may or may not include any other element such as a terminal that is used for the external connection. For example, the same effect of the present invention can be obtained even if a laminated structure comprised of a substrate and a semiconductor chip implemented on the substrate is divided into a plurality of sub-laminated structures in a single lamination step or a plurality of lamination steps of the present invention. In addition, the same effect of the present invention can be obtained even if a chip laminated structure comprised of a plurality of semiconductor chips without a substrate is divided into a plurality of sub-laminated structures in a single division step or a plurality of division steps of the present invention. The chip laminated structure may or may not include a resin, and may or may not include any other element such as a terminal that is used for the external connection.

Furthermore, a step of forming external terminals on the silicon substrate 9 may or may not be performed. If the step of forming the external terminal on the silicon substrate 9 is performed, it may be performed before the lamination steps, or before the division steps and after the lamination steps, or after the division steps.

Furthermore, instead of connecting the external terminal on the silicon substrate 9 directly, it is possible to use a chip having an external connection function by the wafer-level chip size package (W-CSP) technology as the silicon substrate 9.

Furthermore, it is possible to form the laminate structure 100 by laminating at least a semiconductor chip on a substrate other than a semiconductor substrate, such as an organic substrate (e.g., a glass epoxy substrate), a polyimide tape substrate, and a ceramic substrate, instead of the silicon substrate 9, and then form a plurality of sub-laminated structures by dividing the laminated structure through a single division step or plurality of the division steps of the present invention.

As described above, the bumps are arranged on one surface of each of the semiconductor chips, and the semiconductor chips may be implemented on the semiconductor substrate 9 so that the surface thereof on which the bumps are arranged faces downward. However, the semiconductor chips may be implemented on the semiconductor substrate 9 so that the surface thereof on which the bumps are arranged faces upward. Furthermore, the bumps may be arranged on both surfaces of each of the semiconductor chips, and the semiconductor chips may be implemented on the semiconductor substrate.

According to the conventional method of manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be produced through a series of lamination steps and the subsequent division steps. In other words, it is possible to increase the number of semiconductor devices to be produced according to the number of sub-laminated structures produced by dividing the laminated structure through the same series of lamination steps. That is to say, if the same number of semiconductor devices is to be produced through the same lamination method, the required total number of lamination steps can be reduced by a single division step or a plurality of the division steps in accordance with the present invention. Reduction of the required total number of lamination steps makes it possible to reduce the amount of time that the lamination device is used for the lamination steps, and makes it possible to further reduce the manufacturing cost.

Furthermore, the sealing resin 6 injected in the spaces between adjacent chips and the space between the bottom layer chip and the silicon substrate 9 effectively serves to prevent the chips from being chipped and cracked, prevent cutting scrap from getting into the spaces between adjacent chips, and prevent water from getting into the spaces between adjacent chips when the chip laminated structure 10 is cut by the dicing blade 11.

Third Embodiment

Figure 14:
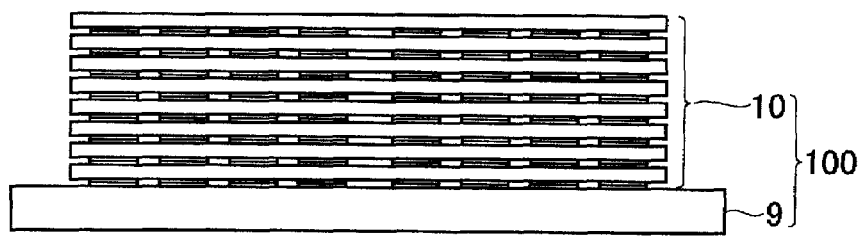
FIG. 14 is a lateral cross-section view of the laminated structure in a step of the method of manufacturing the semiconductor device in accordance with a third embodiment of the present invention.
Figure 15:
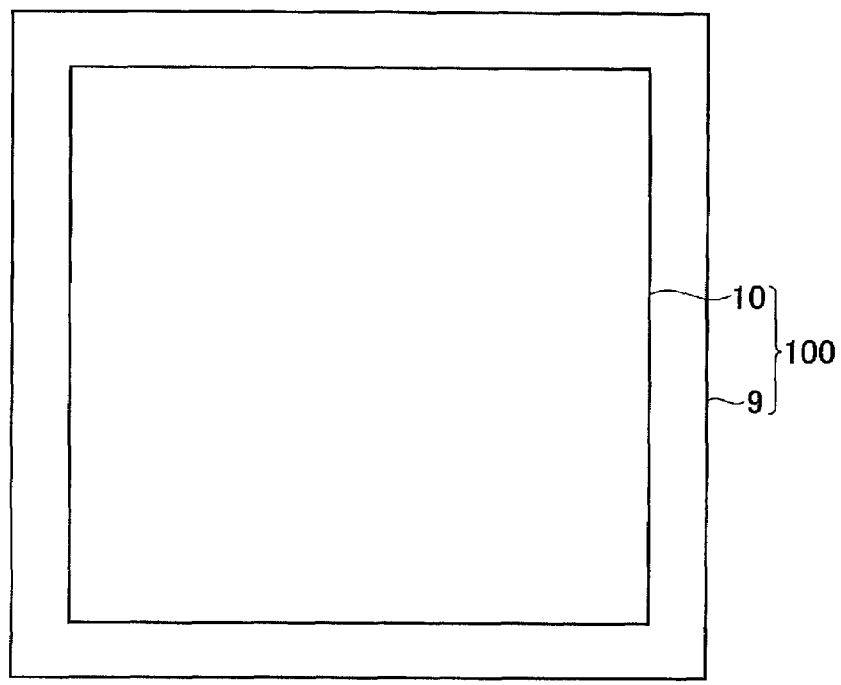
FIG. 15 is a top view of the laminated structure in the step shown in FIG. 14.
Figure 16:
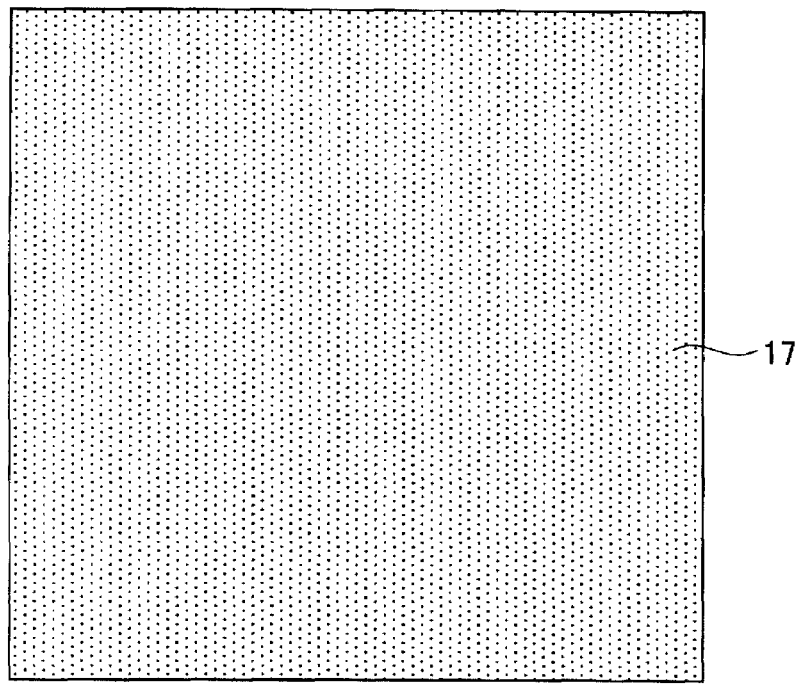
FIG. 16 is a top view of the laminated structure in a step of the method of manufacturing a semiconductor device in accordance with the third embodiment of the present invention.
Figure 17:
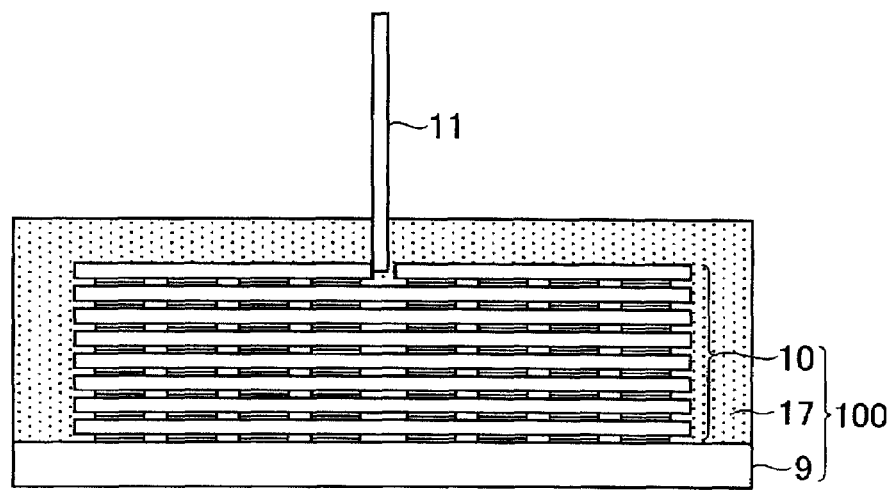
FIG. 17 is a lateral cross-section view of the laminated structure in the step of the method of manufacturing the semiconductor device in accordance with the third embodiment of the present invention and shows a state of the laminated structure before it is divided.
Figure 18:
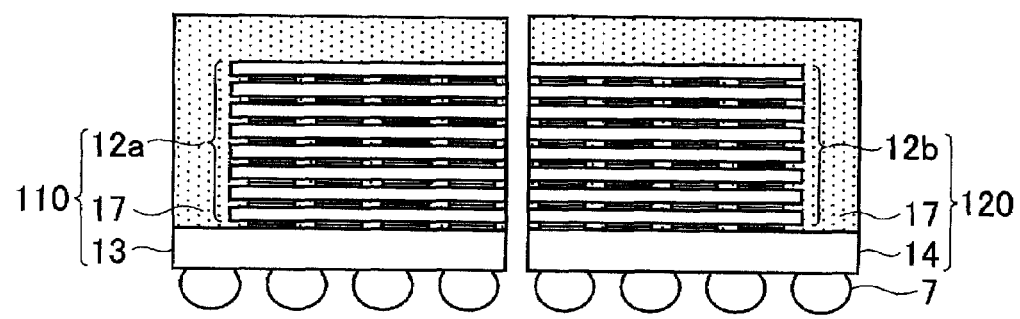
FIG. 18 is a lateral cross-section view of sub-laminated structure into which the laminated structure is divided in a step of the method of manufacturing the semiconductor device in accordance with the third embodiment of the present invention.
Figure 19:
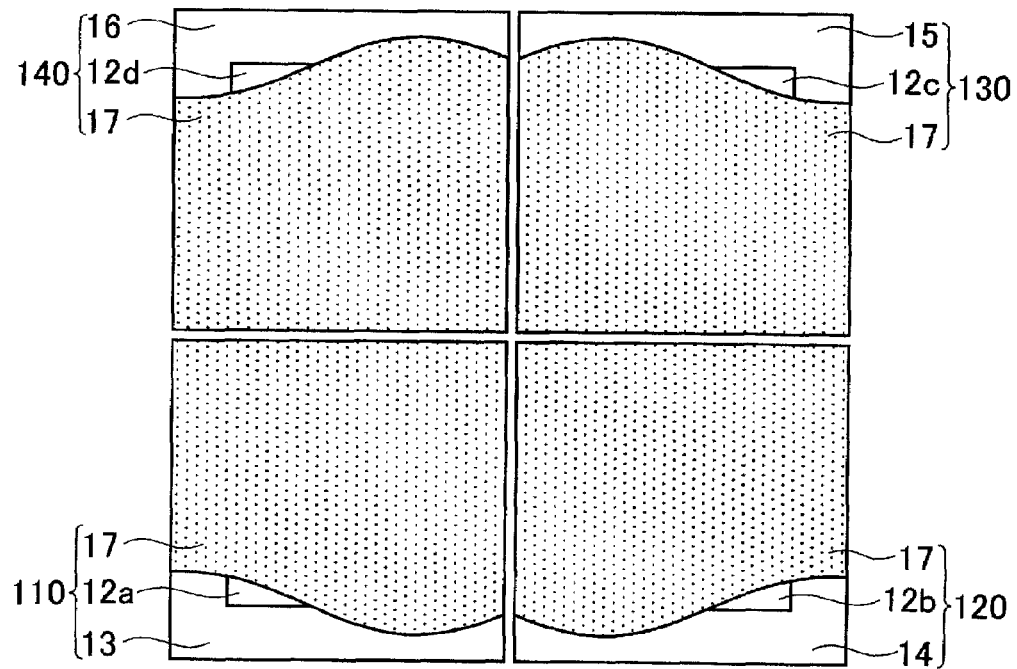
FIG. 19 is a top view of the sub-laminated structures shown in FIG. 18.

In a third embodiment of the present invention, a semiconductor device in which a plurality of chips laminated on a substrate in multilayers and a method for manufacturing the same will be described. FIG. 14 is a lateral cross-section view of the laminated structure in a step of the method of manufacturing the semiconductor device in accordance with the third embodiment of the present invention. FIG. 15 is a top view of the laminated structure in the step shown in FIG. 14. FIG. 16 is a top view of the laminated structure in a step of the method of manufacturing the semiconductor device in accordance with the third embodiment of the present invention. FIG. 17 is a lateral cross-section view of the laminated structure in a step of the method of manufacturing the semiconductor device in accordance with the third embodiment of the present invention, and shows a state of the laminated structure before it is divided. FIG. 18 is a lateral cross-section view of sub-laminated structures into which the laminated structure is divided in a step of the method of manufacturing the semiconductor device in accordance with the third embodiment of the present invention. FIG. 19 is a top view of the sub-laminated structures shown in FIG. 18.

Manufacturing Process

As shown in FIGS. 14 and 15, a silicon substrate 9 is prepared for laminating semiconductor chips in multilayers. The implementation surface dimension of the silicon substrate 9 is more than the upper/lower surface dimension of each of the semiconductor chips to be laminated on the silicon substrate 9. The upper/lower surface dimension of each of the semiconductor chips corresponds to the total upper/lower surface dimensions of the four sub semiconductor chips (hereinafter referred to as "sub semiconductor chips" or simply "sub-chips"), each of which comprised in a final intended semiconductor device. Then, a chip laminated structure 10 is formed on the silicon substrate 9. The chip laminated structure 10 has an eight-layer chip laminated structure and comprised of eight semiconductor chips, each of which has the four-chip dimension. The eight-layer chip laminated structure 10 can be formed by a heretofore known available method, and the forming method thereof is not limited to a specific method. For example, ball pads are arranged on the implementation surface of the silicon substrate 9. On the other hand, bumps are arranged on one surface of the semiconductor chip, and chip ball pads are arranged on the other surface of the semiconductor chip. Eight semiconductor chips may be laminated on the semiconductor substrate 9 in eight layers in the bottom-up order. Alternatively, as described in the first embodiment of the present invention, the new method for laminating semiconductor chips may be performed which was proposed by the inventor of the present invention and disclosed in Japanese Patent Application Publication JP-A-2005-074356.

Furthermore, each of the lamination steps may be performed by any type of method as long as it is performed by connecting the chip ball pads and the bumps by the application of weight, heat, ultrasonic, and the other kinds of energy, and is not limited to a specific method.

Then, the chip laminated structure 10 is set into a mold, and a resin is poured into the mold. Thus, as shown in FIGS. 16 and 17, the chip laminated structure 10 is sealed by an overmold resin 17. As a result, the lateral sides and the upper surface of the chip laminated structure 10 are covered with the overmold resin 17, and the spaces between adjacent chips and the space between the bottom layer chip and the silicon substrate 9 are filled with the overmold resin 17. In this configuration, a heretofore known overmold resin is used as the overmold resin 17. The laminated structure 100 is comprised of the silicon substrate 9, the chip laminated structure 10, and the overmold resin 17.

Next, as shown in FIGS. 17 to 19, division steps are performed for dividing the laminated structure 100 comprised of the silicon substrate 9 and the chip laminated structure 10 implemented on the silicon substrate 9 into four sub-laminated structures (i.e., a first to fourth sub-laminated structures 110, 120, 130, and 140). The division steps can be realized by any available division method. As a typical example of the available division method, the thermal cutting with laser irradiation, and the mechanical cutting with a dicing blade can be suggested. An example of division steps that are performed by the cutting with a dicing blade will be hereinafter explained in detail. The laminated structure 100 is cut downward from the top layer chip comprising the chip laminated structure 10 to the silicon substrate 9 by a dicing blade 11. The cutting is performed for the laminated structure 100 shown in FIGS. 16 and 17 by the dicing blade 11 twice. More specifically, the laminated structure 100 is cut in two directions, perpendicular to each other. Thus, as shown in FIGS. 18 and 19, the laminated structure 100 is divided into four sub-laminated structures (i.e., the first to fourth sub-laminated structures 110, 120, 130, and 140). The overmold resin 17 injected in the spaces between adjacent chips and the space between the bottom layer chip and the silicon substrate 9 effectively serves to prevent the chips from being chipped and cracked, prevent cutting scrap from getting into the spaces between adjacent chips, and prevent water from getting into the spaces between adjacent chips when the chip laminated structure 10 is cut by the dicing blade 11. In addition, the overmold resin 17 that covers the upper surface of the chip laminated structure 10 effectively serves to protect the chip laminated structure 10 from damages such as external impact and stress-caused chip cracks.

In other words, the chip laminated structure 10 is divided into four sub-chip laminated structures (i.e., first to fourth sub-chip laminated structures 12a, 12b, 12c, and 12d). At the same time as this, the silicon substrate 9 is divided into four sub-silicon substrates (i.e., first to fourth sub-silicon substrates 13, 14, 15, and 16). As a result, the laminated structure 100 that is comprised of the silicon substrate 9 and the chip laminated structure 10 is divided into (i) the first sub-laminated structure 110 that is comprised of the first sub-silicon substrate 13 and the first sub-chip laminated structure 12a, (ii) the second sub-laminated structure 120 that is comprised of the second sub-silicon substrate 14 and the second sub-chip laminated structure 12b, (iii) the third sub-laminated structure 130 that is comprised of the third sub-silicon substrate 15 and the third sub-chip laminated structure 12c, and (iv) the fourth sub-laminated structure 140 that is comprised of the fourth sub-silicon substrate 16 and the fourth sub-chip laminated structure 12d. The first to fourth sub-laminated structures 110, 120, 130, and 140, respectively, can comprise a semiconductor device. Then, external terminals 7 are formed on the backside of the first to fourth sub-silicon substrates 13, 14, 15, and 16.

In the third embodiment of the present invention, the division steps are performed after the above described lamination steps. Thus, four semiconductor devices can be produced. According to the conventional method of manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be produced through a series of lamination steps and the subsequent division steps. In other words, it is possible to increase the number of semiconductor devices to be produced according to the number of sub-laminated structures produced by dividing the laminated structure through the same series of lamination steps. That is to say, if the same number of semiconductor devices is to be produced through the same lamination method, the required total number of lamination steps can be reduced by a single division step or a plurality of the division steps in accordance with the present invention. Reduction of the required total number of lamination steps makes it possible to reduce the amount of time that the lamination device is used for the lamination steps, and makes it possible to further reduce the manufacturing cost.

Semiconductor Device Structure

As shown in FIGS. 18 and 19, the first to fourth sub-laminated structures 110, 120, 130, and 140, respectively, has four lateral sides. Two of them are comprised of cutting surfaces defined by cutting the laminated structure 100 by the dicing blade 11 in the above described division steps. The rest of them are comprised of non-cutting surfaces. The two non-cutting surfaces of each of the first to fourth sub-laminated structures 110, 120, 130, and 140 are comprised of the non-cutting surfaces of each of the first to fourth sub-silicon substrates 13, 14, 15, and 16, and lateral portions of the overmold resin 17 that cover the non-cutting surface of each of the first to fourth sub-chip laminated structures 12a, 12b, 12c, and 12d. As shown in FIG. 19, the non-cutting surface of each of the first to fourth sub-chip laminated structures 12a, 12b, 12c, and 12d is clearly positioned inward from the non-cutting surface of each of the first to fourth sub-silicon substrates 13, 14, 15, and 16 in the direction perpendicular to the non-cutting surface. On the other hand, as shown in FIG. 19, the lateral portions of the overmold resin 17 that cover the first to fourth sub-chip laminated structures 12a, 12b, 12c, and 12d are aligned with the non-cutting surface of each of the first to fourth sub-silicon substrates 13, 14, 15, and 16 in the direction perpendicular to the non-cutting surface. On the other hand, two cutting surfaces of each of the first to fourth sub-laminated structures 110, 120, 130, and 140 are comprised of the cutting surface of each of the first to fourth sub-silicon substrates 13, 14, 15, and 16, the cutting surface of each of the first to fourth sub-chip laminated structures 12a, 12b, 12c, and 12d, and the cutting surface of the overmold resin 17 that covers the upper surface of each of the first to fourth sub-chip laminated structures 12a, 12b, 12c, and 12d and is injected into the spaces between adjacent chips, and the space between the bottom layer chip and the silicon substrate 9. In other words, as shown in FIG. 19, the cutting surface of each of the first to fourth sub-chip laminated structures 12a, 12b, 12c, and 12d is aligned with the cutting surface of each of the first to fourth sub-silicon substrates 13, 14, 15, and 16 and the cutting surface of the overmold resin 17 in the direction perpendicular to the cutting surface.

The upper surface of each of the first to fourth sub-laminated structures 110, 120, 130, and 140 is comprised of the upper surface of the overmold resin 17. Therefore, the overmold resin 17 effectively serves to prevent light from entering the interior of each of the sub-laminated structures 110, 120, 130, and 140 from the upper portion of the chip.

In addition, the upper surface of each of the first to fourth sub-laminated structures 110, 120, 130, and 140 is comprised of the upper surface of the overmold resin 17. Therefore, overviews of the upper portions of the first to fourth sub-laminated structures 110, 120, 130, and 140 are the same.

Alternative Example

Note that the laminated structure 100 is divided into four sub-laminated structures (i.e., the first to fourth sub-laminated structures 110, 120, 130, and 140 in the third embodiment of the present invention), but the number of the sub-laminated structures is not limited to a specific number as long as it is two or greater. For example, according to the present invention, it is possible to produce more semiconductor devices even if the conventional lamination steps are used, compared to the conventional method, if a division of 2×1, 2×2, 2×3, 3×1, 3×3, 3×4, 4×4, 4×5, 5×1, 5×2, 5×3, 5×5 . . . or 10×10 is performed.

Furthermore, in the third embodiment of the present invention, eight semiconductor chips are laminated on the silicon substrate 9 in eight layers. However, the number of laminated semiconductor chip is not limited to eight as long as at least a semiconductor chip is implemented on the silicon substrate 9. In short, the division step of the present invention may be any type of step as long as the laminated structure is divided into a plurality of sub-laminated structures. The laminated structure may or may not include a resin, and may or may not include any other element such as a terminal that is used for the external connection. For example, the same effect of the present invention can be obtained even if a laminated structure comprised of a substrate and a semiconductor chip implemented on the substrate is divided into a plurality of sub-laminated structures in a single lamination step or a plurality of lamination steps of the present invention. In addition, the same effect of the present invention can be obtained even if a chip laminated structure comprised of a plurality of semiconductor chips without a substrate is divided into a plurality of sub-laminated structures in a single division step or a plurality of division steps of the present invention. The chip laminated structure may or may not include a resin, and may or may not include any other element such as a terminal that is used for the external connection.

Furthermore, a step of forming external terminals on the silicon substrate 9 may or may not be performed. If the step of forming the external terminal on the silicon substrate 9 is performed, it may be performed before the lamination steps, or before the division steps and after the lamination steps, or after the division steps.

Furthermore, instead of connecting the external terminal on the silicon substrate 9 directly, it is possible to use a chip having a external connection function by the wafer-level chip size package (W-CSP) technology as the silicon substrate 9.

Furthermore, it is possible to form the laminate structure 100 by laminating at least a semiconductor chip on a substrate other than a semiconductor substrate, such as an organic substrate (e.g., a glass epoxy substrate), a polyimide tape substrate, and a ceramic substrate, instead of the silicon substrate 9, and then form a plurality of sub-laminated structures by dividing the laminated structure through a single division step or plurality of the division steps of the present invention.

As described above, the bumps are arranged on one surface of each of the semiconductor chips, and the semiconductor chips may be implemented on the semiconductor substrate 9 so that the surface thereof on which the bumps are arranged faces downward. However, the semiconductor chips may be implemented on the semiconductor substrate 9 so that the surface thereof on which the bumps are arranged faces upward. Furthermore, the bumps may be arranged on both surfaces of each of the semiconductor chips, and the semiconductor chips may be implemented on the semiconductor substrate.

According to the conventional method of manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be produced through a series of lamination steps and the subsequent division steps. In other words, it is possible to increase the number of semiconductor devices to be produced according to the number of sub-laminated structures produced by dividing the laminated structure through the same series of lamination steps. That is to say, if the same number of semiconductor devices is to be produced through the same lamination method, the required total number of lamination steps can be reduced by a single division step or a plurality of the division steps in accordance with the present invention. Reduction of the required total number of lamination steps makes it possible to reduce the amount of time that the lamination device is used for the lamination steps, and makes it possible to further reduce the manufacturing cost.

Furthermore, the sealing resin 17 injected in the spaces between adjacent chips and the space between the bottom layer chip and the silicon substrate 9 effectively serves to prevent the chips from being chipped and cracked, prevent cutting scrap from getting into the spaces between adjacent chips, and prevent water from getting into the spaces between adjacent chips when the chip laminated structure 10 is cut by the dicing blade 11. In addition, the overmold resin 17 that covers the upper surface of the chip laminated structure 10 effectively serves to protect the chip laminated structure 10 from damages such as external impact and stress-caused chip cracks.

In addition, the upper surface of each of the first to fourth sub-laminated structures 110, 120, 130, and 140 is comprised of the upper surface of the overmold resin 17. Therefore, the overmold resin 17 effectively serves to prevent light from entering the interior of each of the sub-laminated structures 110, 120, 130, and 140 from the upper portion of the chip.

In addition, the upper surface of each of the first to fourth sub-laminated structures 110, 120, 130, and 140 is comprised of the upper surface of the overmold resin 17. Therefore, overviews of the upper portions of the first to fourth sub-laminated structures 110, 120, 130, and 140 are the same.

Fourth Embodiment

Figure 20:
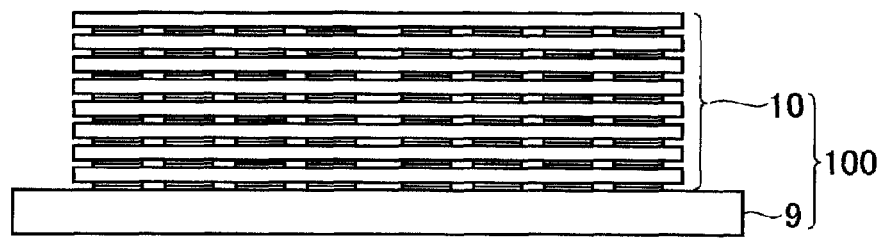
FIG. 20 is a lateral cross-section view of the laminated structure in a step of the method of manufacturing the semiconductor device in accordance with a fourth embodiment of the present invention.
Figure 21:
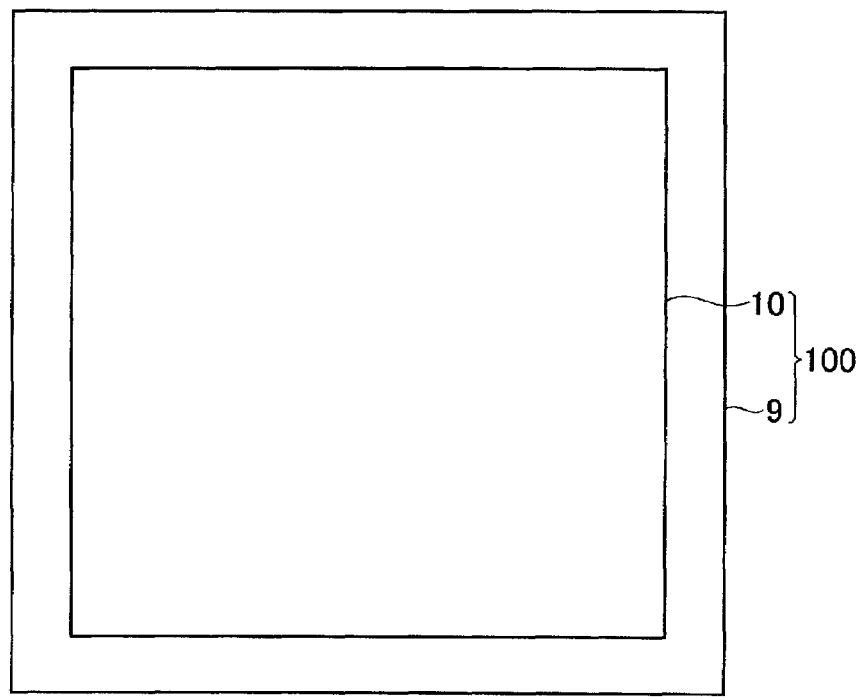
FIG. 21 is a top view of the laminated structure in the step shown in FIG. 20.
Figure 22:
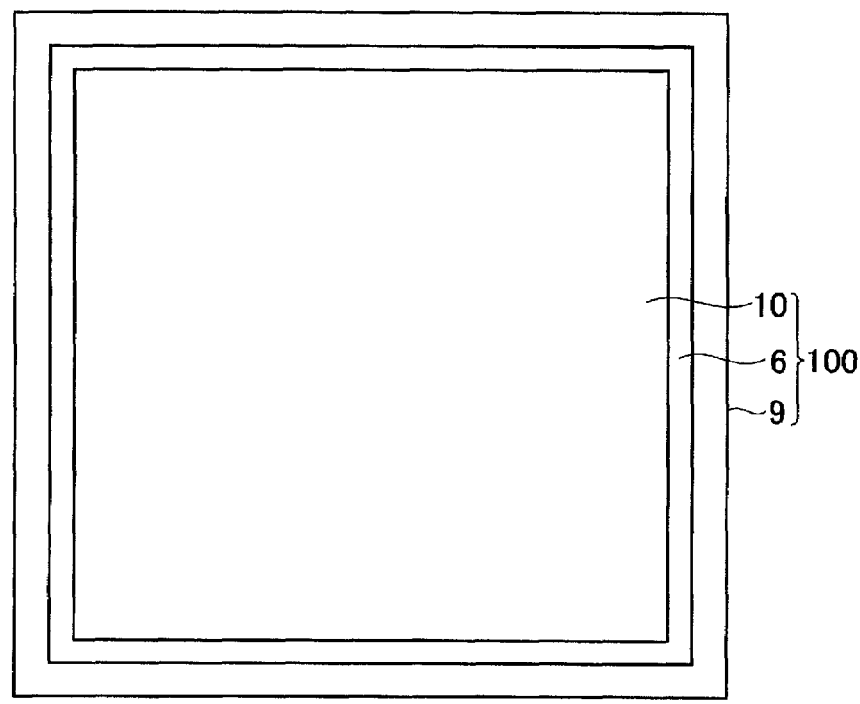
FIG. 22 is a top view of the laminated structure in a step of the method of manufacturing a semiconductor device in accordance with the fourth embodiment of the present invention.
Figure 23:
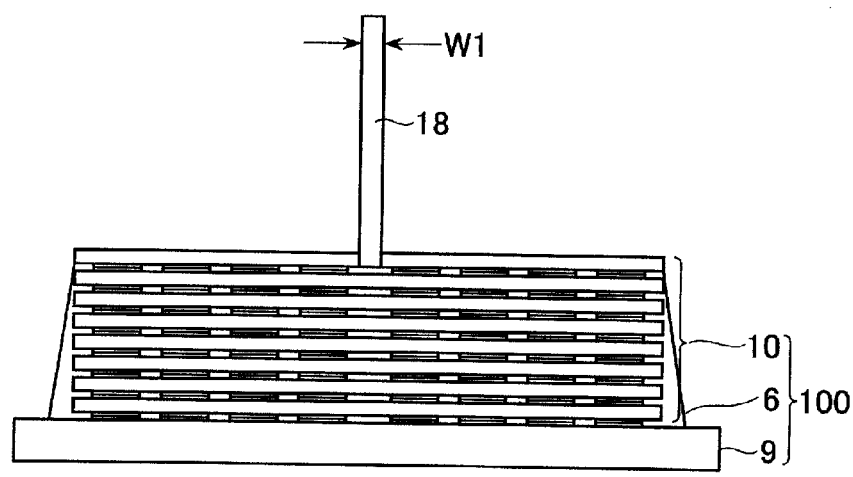
FIG. 23 is a lateral cross-section view of the laminated structure in the step of the method of manufacturing the semiconductor device in accordance with the fourth embodiment of the present invention, and shows a state of the laminated structure before a first division of the laminated structure is performed.
Figure 24:
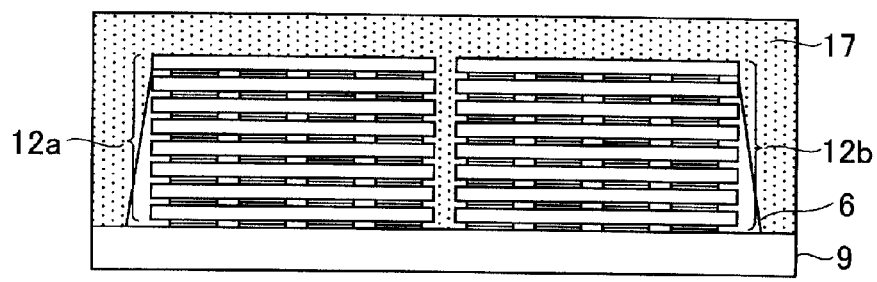
FIG. 24 is a lateral cross-section view of the laminated structure after the first division of the laminated structure is performed in a step of the method of manufacturing the semiconductor device in accordance with the fourth embodiment of the present invention.
Figure 25:
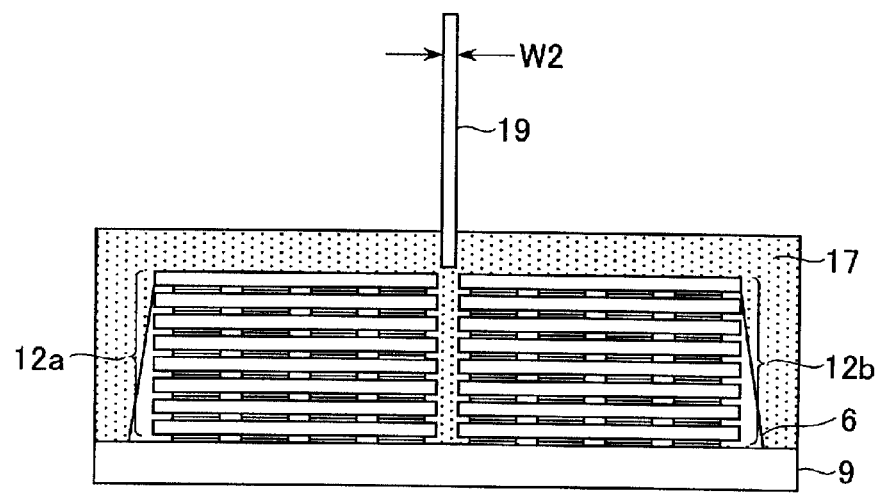
FIG. 25 is a lateral cross-section view of the laminated structure in a step of the method of manufacturing the semiconductor device in accordance with the fourth embodiment of the present invention and shows a state of the laminated structure before a second division of the laminated structure is performed.
Figure 26:
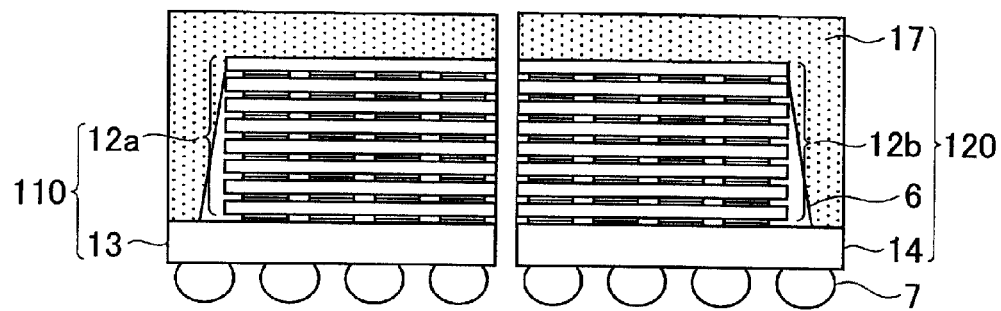
FIG. 26 is a lateral cross-section view of the sub-laminated structures into which the laminated structure is divided in the second division step in a step of the method of manufacturing the semiconductor device in accordance with the fourth embodiment of the present invention.
Figure 27:
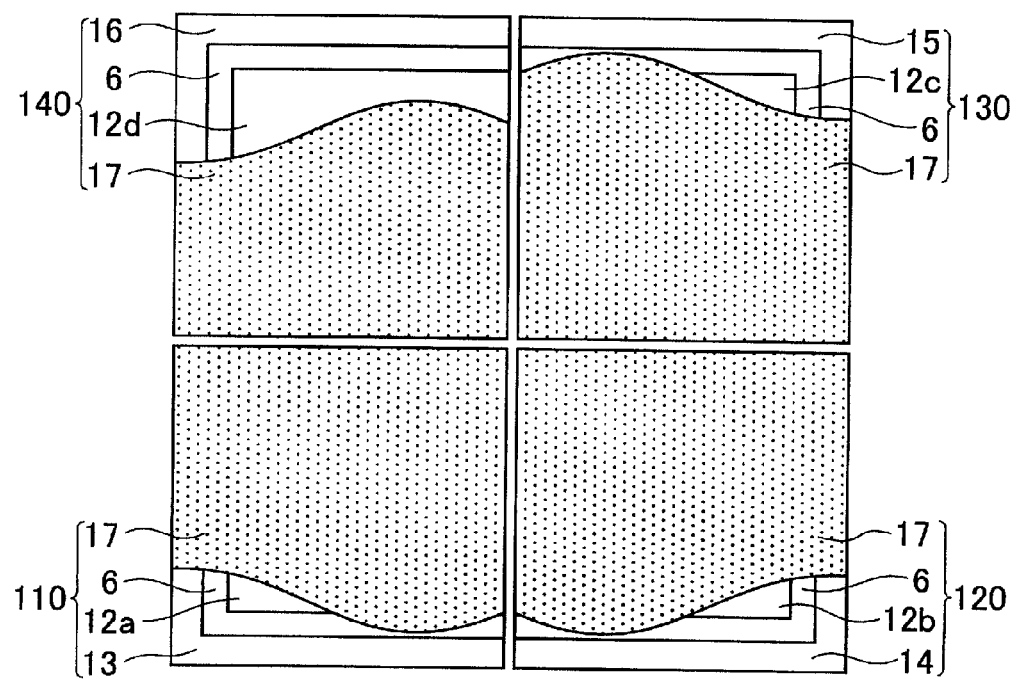
FIG. 27 is a top view of the sub-laminated structures shown in FIG. 26.

In a fourth embodiment of the present invention, a semiconductor device in which a plurality of chips laminated on a substrate in multilayers and a method for manufacturing the same will be described. FIG. 20 is a lateral cross-section view of the laminated structure in a step of the method of manufacturing the semiconductor device in accordance with the fourth embodiment of the present invention. FIG. 21 is a top view of the laminated structure in the step shown in FIG. 20. FIG. 22 is a top view of the laminated structure in a step of the method of manufacturing the semiconductor device in accordance with the fourth embodiment of the present invention. FIG. 23 is a lateral cross-section view of the laminated structure in the step of the method of manufacturing the semiconductor device in accordance with the fourth embodiment of the present invention and shows a state of the laminated structure before a first division of the laminated structure is performed. FIG. 24 is a lateral cross-section view of the laminated structures after the first division step of the laminated structure is performed in a step of the method of manufacturing the semiconductor device in accordance with the fourth embodiment of the present invention. FIG. 25 is a lateral cross-section view of the laminated structure in a step of the method of manufacturing the semiconductor device in accordance with the fourth embodiment of the present invention and shows a state of the laminated structure before a second division step of the laminated structure is performed. FIG. 26 is a lateral cross-section view of the sub-laminated structures into which the laminated structures is divided in the second division step in a step of the method of manufacturing the semiconductor device in accordance with the fourth embodiment of the present invention. FIG. 27 is a top view of the sub-laminated structures shown in FIG. 26.

Manufacturing Process

As shown in FIGS. 20 and 21, a silicon substrate 9 is prepared for laminating semiconductor chips in multilayers. The implementation surface dimension of the silicon substrate 9 is more than the upper/lower surface dimension of each of the semiconductor chips to be laminated on the silicon substrate 9. The upper/lower surface dimension of each of the semiconductor chips corresponds to the total upper/lower surface dimensions of the four sub semiconductor chips (hereinafter referred to as "sub semiconductor chips" or simply "sub-chips"), each of which comprised in a final intended semiconductor device. Then, a chip laminated structure 10 is formed on the silicon substrate 9. The chip laminated structure 10 has an eight-layer chip laminated structure and comprised of eight semiconductor chips, each of which has the four-chip dimension. The eight-layer chip laminated structure 10 can be formed by a heretofore known conventional method, and the forming method thereof is not limited to a specific method. For example, ball pads are arranged on the implementation surface of the silicon substrate 9. On the other hand, bumps are arranged on one surface of the semiconductor chip, and chip ball pads are arranged on the other surface of the semiconductor chip. Eight semiconductor chips may be laminated on the semiconductor substrate 9 in eight layers in the bottom-up order. Alternatively, as described in the first embodiment of the present invention, the new method for laminating semiconductor chips may be performed which was proposed by the inventor of the present invention and disclosed in Japanese Patent Application Publication JP-A-2005-074356.

Furthermore, each of the lamination steps may be performed by any type of method as long as it is performed by connecting the chip ball pads and the bumps by the application of weight, heat, ultrasonic, and the other kinds of energy, and is not limited to a specific method.

As shown in FIGS. 22 and 23, a liquid resin is injected by a dispenser into spaces between adjacent chips in the chip laminated structure 10, a space between the bottom layer chip in the chip laminated structure 10 and the substrate 9, and on the lateral sides of the chip laminated structure 10. Thus, a sealing resin 6 for sealing the chips is formed. In this configuration, a heretofore known liquid resin is used for sealing the chips. For example, a nonconductive paste (NCP) resin or an anisotropic conductive paste (ACP) resin can be used. The distance between the adjacent chips is approximately 10 to 20 μm, for instance. Therefore, it is possible to inject the sealing resin into the spaces with capillary phenomenon. The laminated structure 100 is comprised of the silicon substrate 9, the chip laminated structure 10, and the sealing resin 6.

Next, as shown in FIGS. 23 to 24, a first division step is performed for dividing the chip laminated structure 10 implemented on the silicon substrate 9 into four sub-chip laminated structures (i.e., a first to fourth sub-chip laminated structures 12a, 12b, 12c, and 12d). In this configuration, the silicon substrate 9 is not divided into pieces. The first division step can be realized by any available division method. As a typical example of the available division method, the thermal cutting with laser irradiation, and the mechanical cutting with a dicing blade can be suggested. An example of division steps that are performed by the cutting with a dicing blade will be hereinafter explained in detail. The laminated structure 100 is cut downward from the top layer chip comprising the chip laminated structure 10 to the sealing resin 6 injected on the upper surface of the silicon substrate 9 by a first dicing blade 18 with a first cutting width W1. The cutting is performed for the chip laminated structure 10 shown in FIGS. 22 and 23 by the first dicing blade 18 twice. More specifically, the laminated structure 100 is cut in two directions, perpendicular to each other. Thus, as shown in FIGS. 24 and 25, the chip laminated structure 10 is divided into four sub-chip laminated structures (i.e., the first to fourth sub-chip laminated structures 12a, 12b, 12c, and 12d). The sealing resin 6 injected in the spaces between adjacent chips and the space between the bottom layer chip and the silicon substrate 9 effectively serves to prevent the chips from being chipped and cracked, prevent cutting scrap from getting into the spaces between adjacent chips, and prevent water from getting into the spaces between adjacent chips when the chip laminated structure 10 is cut by the first dicing blade 18. In other words, the chip laminated structure 10 is divided into four sub-chip laminated structures (i.e., first to fourth sub-chip laminated structures 12a, 12b, 12c, and 12d). On the other hand, the silicon substrate 9 is not divided into pieces. As a result, four sub-chip laminated structures 12a, 12b, 12c, and 12d are formed on the silicon substrate 9. The four sub-chip laminated structures 12a, 12b, 12c, and 12d are separated from each other through a gap corresponding to the first cutting width W1. In other words, intersecting gaps, which correspond to the first cutting width W1 and separate the first to fourth sub-chip laminated structures 12a, 12b, 12c, and 12d from each other, are formed by cutting the chip laminated structure 10 using the first dicing blade 18 with the first cutting width W1.

Then, the chip laminated structure 10 is set into a mold, and a resin is poured into the mold. Thus, as shown in FIGS. 24 and 25, the chip laminated structure 10 is sealed by an overmold resin 17. As a result, the lateral sides and the upper surface of each of the first to fourth sub-chip laminated structures 12a, 12b, 12c, and 12d are covered with the overmold resin 17, and the above described gaps corresponding to the first cutting width W1, the spaces between adjacent chips, and the space between the bottom layer chip and the silicon substrate 9 are filled with the overmold resin 17. In this configuration, a heretofore known overmold resin is used as the overmold resin 17. The laminated structure 100 is comprised of the silicon substrate 9, the chip laminated structure 10, the sealing resin 6, and the overmold resin 17.

Next, as shown in FIGS. 25 to 27, a second division step is performed for dividing the laminated structure 100 that is comprised of the silicon substrate 9 and the first to fourth sub-chip laminated structures 12a, 12b, 12c, and 12d implemented on the silicon substrate 9 into four sub-laminated structures (i.e., a first to fourth sub-laminated structures 110, 120, 130, and 140). The second division step can be realized by an available division method. As a typical example of the available division method, the thermal cutting with laser irradiation, and the mechanical cutting with a dicing blade can be suggested. An example of division steps that are performed by the cutting with a dicing blade will be hereinafter explained in detail. The overmold 17 filling the intersecting gaps which correspond to the first cutting width W1 and separate the first to fourth sub-chip laminated structures 12a, 12b, 12c, and 12d from each other, and the silicon substrate 9 are cut by a second dicing blade 19 with a second cutting width W2 that is smaller than the first cutting width W1 of the first dicing blade 18. In this configuration, the second cutting width W2 of the second dicing blade 19 is smaller than the first cutting width WI of the first dicing blade 18. Therefore, the second dicing blade 19 cuts only the overmold resin 17 and the silicon substrate 9, and does not contact the cutting surface of each of the already divided first to fourth sub-chip laminated structures 12a, 12b, 12c, and 12d. The cutting is performed for the laminated structure 100 shown in FIGS. 24 and 25 by the second dicing blade 19 twice. More specifically, the laminated structure 100 is cut in two directions, perpendicular to each other. Thus, as shown in FIGS. 26 and 27, the laminated structure 100 is divided into four sub-laminated structures (i.e., the first to fourth sub-laminated structures 110, 120, 130, and 140).

In other words, the silicon substrate 9 is divided into four sub-silicon substrates (i.e., first to fourth sub-silicon substrates 13, 14, 15, and 16). As a result, the laminated structure 100 that is comprised of the silicon substrate 9 and the first to fourth sub-chip laminated structures 12a, 12b, 12c, and 12d is divided into (i) the first sub-laminated structure 110 that is comprised of the first sub-silicon substrate 13 and the first sub-chip laminated structure 12a, (ii) the second sub-laminated structure 120 that is comprised of the second sub-silicon substrate 14 and the second sub-chip laminated structure 12b, (iii) the third sub-laminated structure 130 that is comprised of the third sub-silicon substrate 15 and the third sub-chip laminated structure 12c, and (iv) the fourth sub-laminated structure 140 that is comprised of the fourth sub-silicon substrate 16 and the fourth sub-chip laminated structure 12d. The first to fourth sub-laminated structures 110, 120, 130, and 140, respectively, can comprise a semiconductor device. Then, external terminals 7 are formed on the backside of the first to fourth sub-silicon substrates 13, 14, 15, and 16.

In the fourth embodiment of the present invention, the division steps are performed after the above described lamination steps. Thus, four semiconductor devices can be produced. According to the conventional method of manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be produced through a series of lamination steps and the subsequent division steps. In other words, it is possible to increase the number of semiconductor devices to be produced according to the number of sub-laminated structures produced by dividing the laminated structure through the same series of lamination steps. That is to say, if the same number of semiconductor devices are to be produced through the same lamination method, the required total number of lamination steps can be reduced by a single division step or a plurality of the division steps in accordance with the present invention. Reduction of the required total number of lamination steps makes it possible to reduce the amount of time that the lamination device is used for the lamination steps, and makes it possible to further reduce the manufacturing cost.

Semiconductor Device Structure

As shown in FIGS. 26 and 27, the first to fourth sub-laminated structures 110, 120, 130, and 140, respectively, has four lateral sides. Two of them are comprised of cutting surfaces defined by cutting the laminated structure 100 by the second dicing blade 19 in the above described second division step. The rest of them are comprised of non-cutting surfaces. The two non-cutting surfaces of each of the first to fourth sub-laminated structures 110, 120, 130, and 140 are comprised of the non-cutting surfaces of each of the first to fourth sub-silicon substrates 13, 14, 15, and 16, and lateral portions of the overmold resin 17 covering the sealing resin 6 that covers the non-cutting surface of each of the first to fourth sub-chip laminated structures 12a, 12b, 12c, and 12d. As shown in FIG. 27, the non-cutting surface of each of the first to fourth sub-chip laminated structures 12a, 12b, 12c, and 12d is clearly positioned inward from the non-cutting surface of each of the first to fourth sub-silicon substrates 13, 14, 15, and 16 in the direction perpendicular to the non-cutting surface. On the other hand, as shown in FIG. 27, the lateral portions of the overmold resin 17 covering the sealing resin 6 that covers the non-cutting surface of each of the first to fourth sub-chip laminated structures 12a, 12b, 12c, and 12d are aligned with the non-cutting surface of each of the first to fourth sub-silicon substrates 13, 14, 15, and 16 in the direction perpendicular to the non-cutting surface. On the other hand, the two cutting surfaces of each of the first to fourth sub-laminated structures 110, 120, 130, and 140, respectively, are comprised of the cutting surfaces of each of the first to fourth sub-silicon substrates 13, 14, 15, and 16, the cutting surface of each of the first to fourth sub-chip laminated structures 12a, 12b, 12c, and 12d, and the cutting surface of the overmold resin 17 that covers the upper surface of each of the first to fourth sub-chip laminated structures 12a, 12b, 12c, and 12d and the cutting surface thereof formed by the first dicing blade 18 in the above described first division step. As shown in FIG. 27, the cutting surface of each of the first to fourth sub-chip laminated structures 12a, 12b, 12c, and 12d is positioned inward from the cutting surface of each of the first to fourth sub-silicon substrates 13, 14, 15, and 16 and the cutting surface of the overmold resin 17 in the direction perpendicular to the cutting surface. On the other hand, the cutting surface of each of the first to fourth sub-silicon substrates 13, 14, 15, and 16 is aligned with the cutting surface of the overmold resin 17 in the direction perpendicular to the cutting surface. Through the first and second cutting steps of the present invention, each of the first to fourth sub-laminated structures 110, 120, 130, and 140, which comprises a semiconductor device, is aligned with the cutting surface of each of the first to fourth sub-silicon substrates 13, 14, 15, and 16 in the direction perpendicular to the cutting surface, and includes the cutting surface of the overmold resin 17 that covers the cutting surface of each of the sub-chip laminated structures 12a, 12b, 12c, and 12d.

In addition, the upper surface and the cutting surfaces of each of the first to fourth sub-laminated structures 110, 120, 130, and 140 are comprised of the upper surface and the cutting surfaces of the overmold resin 17. Therefore, the overmold resin 17 effectively serves to prevent light from entering the interior of each of the sub-laminated structures 110, 120, 130, and 140 from the upper portion or the lateral side of the chip.

In addition, the upper surface and the cutting surfaces of each of the first to fourth sub-laminated structures 110, 120, 130, and 140 are comprised of the upper surface and the cutting surfaces of the overmold resin 17. Therefore, overviews of the upper portions and the lateral sides of the first to fourth sub-laminated structures 110, 120, 130, and 140 are the same.

Alternative Example

In the fourth embodiment, the first division step is performed with the first dicing blade 18 after the sealing resin 6 comprised of the liquid resin is filled with respect to the laminated structure 100. However, the first division step may be performed with the first dicing blade 18 without filling the sealing resin 6 comprised of the liquid resin with respect to the laminated structure 100.

The overmold resin 17 may be formed after the completion of the first division step, and the second division step may be performed with the second dicing blade 19.

In addition, the silicon substrate 9 is not cut at all in the first division step using the first dicing blade 18. However, half the thickness of the silicon substrate 9 may be cut and thus a notch/groove may be formed. Accordingly, the notch/groove effectively serves to prevent water from intruding in the second division step.

Note that the laminated structure 100 is divided into four sub-laminated structures (i.e., the first to fourth sub-laminated structures 110, 120, 130, and 140 in the fourth embodiment of the present invention), but the number of the sub-laminated structures is not limited to a specific number as long as it is two or greater. For example, according to the present invention, it is possible to produce more semiconductor devices even if the conventional lamination steps are used, compared to the conventional method, if a division of 2×1, 2×2, 2×3, 3×1, 3×3, 3×4, 4×4, 4×5, 5×1, 5×2, 5×3, 5×5 . . . or 10×10 is performed.

In the fourth embodiment of the present invention, the forming step of the sealing resin 6 comprised of a liquid resin is performed after the completion of the forming steps of the chip laminated structure 10. However, the liquid resin may be applied on one surface of each of the chips before each of the chips is laminated, and then the chips may be laminated so that the liquid resin is interposed between the chips. In this configuration, for example, the liquid resin is applied to at least either the upper surface of the silicon substrate 9 or the lower surface of the bottom layer chip, and then the bottom layer chip is laminated on the silicon substrate 9. Furthermore, the liquid resin is applied to at least either the upper surface of the bottom layer chip or the lower surface of the second layer chip to be laminated on the bottom layer chip, and then the second layer chip is laminated on the bottom layer chip. The chip laminated structure 10 may be formed by repeating the above described steps. Furthermore, it is possible to laminate chips by interposing an insulator film between adjacent chips. For example, a nonconductive paste (NCP) or an anisotropic conductive paste (ACP) can be used as the insulator film.

Furthermore, in the fourth embodiment of the present invention, eight semiconductor chips are laminated on the silicon substrate 9 in eight layers. However, the number of laminated semiconductor chip is not limited to eight as long as at least a semiconductor chip is implemented on the silicon substrate 9. In short, the division step of the present invention may be any type of step as long as the laminated structure is divided into a plurality of sub-laminated structures. The laminated structure may or may not include a resin, and may or may not include any other element such as a terminal that is used for the external connection. For example, the same effect of the present invention can be obtained even if a laminated structure comprised of a substrate and a semiconductor chip implemented on the substrate is divided into a plurality of sub-laminated structures in a single division step or a plurality of lamination steps of the present invention. In addition, the same effect of the present invention can be obtained even if a chip laminated structure comprised of a plurality of semiconductor chips without a substrate is divided into a plurality of sub-laminated structures in a single division step or a plurality of division steps of the present invention. The chip laminated structure may or may not include a resin, and may or may not include any other element such as a terminal that is used for the external connection.

Furthermore, a step of forming external terminals on the silicon substrate 9 may or may not be performed. If the step of forming the external terminal on the silicon substrate 9 is performed, it may be performed before the lamination steps, or before the division steps and after the lamination steps, or after the division steps.

Furthermore, instead of connecting the external terminal on the silicon substrate 9 directly, it is possible to use a chip having a external connection function by the wafer-level chip size package (W-CSP) technology as the silicon substrate 9.

Furthermore, it is possible to form the laminate structure 100 by laminating at least a semiconductor chip on a substrate other than a semiconductor substrate, such as an organic substrate (e.g., a glass epoxy substrate), a polyimide tape substrate, and a ceramic substrate, instead of the silicon substrate 9, and then form a plurality of sub-laminated structures by dividing the laminated structure through a single step or plurality of the division steps of the present invention.

As described above, the bumps are arranged on one surface of each of the semiconductor chips, and the semiconductor chips may be implemented on the semiconductor substrate 9 so that the surface thereof on which the bumps are arranged faces downward. However, the semiconductor chips may be implemented on the semiconductor substrate 9 so that the surface thereof on which the bumps are arranged faces upward. Furthermore, the bumps may be arranged on both surfaces of each of the semiconductor chips, and the semiconductor chips may be implemented on the semiconductor substrate.

According to the conventional method of manufacturing a semiconductor device, a semiconductor device can be produced through a series of lamination steps. On the other hand, according to the present invention, a plurality of semiconductor devices, the number of which corresponds to that of the sub-laminated structures produced by dividing the laminated structure, can be produced through a series of lamination steps and the subsequent division steps. In other words, it is possible to increase the number of semiconductor devices to be produced according to the number of sub-laminated structures produced by dividing the laminated structure through the same series of lamination steps. That is to say, if the same number of semiconductor devices is to be produced through the same lamination method, the required total number of lamination steps can be reduced by a single division step or a plurality of the division steps in accordance with the present invention. Reduction of the required total number of lamination steps makes it possible to reduce the amount of time that the lamination device is used for the lamination steps, and makes it possible to further reduce the manufacturing cost.

In addition, the sealing resin 6 injected in the spaces between adjacent chips and the space between the bottom layer chip and the silicon substrate 9 effectively serves to prevent the chips from being chipped and cracked, prevent cutting scrap from getting into the spaces between adjacent chips, and prevent water from getting into the spaces between adjacent chips when the chip laminated structure 10 is cut by the first dicing blade 18. In addition, the overmold resin 17 that covers the upper surface of the first to fourth sub-chip laminated structures 12a, 12b, 12c, and 12d effectively serves to protect the first to fourth sub-chip laminated structures 12a, 12b, 12c, and 12d from damage such as external impact and stress-caused chip cracks.

In addition, the upper surface and the cutting surfaces of each of the first to fourth sub-laminated structures 110, 120, 130, and 140 are comprised of the upper surface and the cutting surfaces of the overmold resin 17. Therefore, the overmold resin 17 effectively serves to prevent light from entering the interior of each of the sub-laminated structures 110, 120, 130, and 140 from the upper portion or the lateral side of the chip.

In addition, the upper surface and the cutting surfaces of each of the first to fourth sub-laminated structures 110, 120, 130, and 140 are comprised of the upper surface and the cutting surfaces of the overmold resin 17. Therefore, overviews of the upper portions and the lateral sides of the first to fourth sub-laminated structures 110, 120, 130, and 140 are the same.

GENERAL INTERPRETATION OF TERMS

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applied to words having similar meanings such as the terms, "including," "having," and their derivatives. Also, the term "part," "section," "portion," "member," or "element" when used in the singular can have the dual meaning of a single part or a plurality of parts. Finally, terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments

What is claimed is:

1. A method of manufacturing a semiconductor device, comprising the steps of:
   preparing a laminated structure comprising a substrate and a plurality of chips stacked on the substrate, the plurality of chips collectively forming multiple layers on the substrate, each chip forming one of the multiple layers, one of the chips being formed on an adjacent one of the chips; and
   dividing the laminated structure into a plurality of sub-laminated structures, wherein the step of dividing comprises the steps of:
   cutting the plurality of chips with a first cutting width;
   providing an overmold resin for covering the plurality of sub-laminated structures laminated on the substrate and filling gaps between adjacent sub-laminated structures of the plurality of the sub-laminated structures; and
   cutting the substrate and the overmold resin that fills the gaps between the adjacent sub-laminated structures of the plurality of the sub-laminated structures with a second cutting width that is smaller than the first cutting width.

2. A method of manufacturing a semiconductor device, comprising the steps of:
   preparing a laminated structure comprising a substrate and a plurality of chips stacked on the substrate, the plurality of chips collectively forming multiple layers on the substrate, each chip forming one of the multiple layers, one of the chips being formed on an adjacent one of the chips; and
   dividing the laminated structure into a plurality of sub-laminated structures, wherein the step of dividing comprises the steps of:
   cutting the plurality of chips with a first cutting width, and simultaneously therewith, forming a notch/groove in the substrate by cutting the substrate to a predetermined thickness thereof;
   providing an overmold resin for covering the plurality of sub-laminated structures laminated on the substrate and filling gaps between adjacent sub-laminated structures of the plurality of the sub-laminated structures and the notch/groove; and
   cutting the substrate and the overmold resin that fills the gaps between the adjacent sub-laminated structures of the plurality of the laminated structures and the notch/groove with a second cutting width that is smaller than the first cutting width.

3. A method of manufacturing a semiconductor device, comprising the steps of:
   preparing a laminated structure comprising a substrate and a plurality of chips stacked on the substrate, the plurality of chips collectively forming multiple layers on the substrate, each chip forming one of the multiple layers, one of the chips being formed on an adjacent one of the chips; and
   dividing the laminated structure into a plurality of sub-laminated structures, wherein the step of preparing the laminated structure comprises the step of laminating the plurality of chips on a substrate while a liquid resin is applied at least between the substrate and a chip of the plurality of chips to be laminated directly on the substrate, or between the plurality of chips to be adjacently laminated, and wherein the step of dividing comprises the steps of:
   cutting the plurality of chips with a first cutting width;
   providing an overmold resin for covering the plurality of sub-laminated structures laminated on the substrate and filling gaps between adjacent sub-laminated structures of the plurality of the sub-laminated structures; and
   cutting the substrate and the overmold resin that fills the gaps between the adjacent sub-laminated structures of the plurality of the sub-laminated structures with a second cutting width that is smaller than the first cutting width.

4. A method of manufacturing a semiconductor device, comprising the steps of:
   preparing a laminated structure comprising a substrate and a plurality of chips stacked on the substrate, the plurality of chips collectively forming multiple layers on the substrate, each chip forming one of the multiple layers, one of the chips being formed on an adjacent one of the chips; and
   dividing the laminated structure into a plurality of sub-laminated structures,
   wherein the step of preparing the laminated structure comprises the step of laminating the plurality of chips on a substrate while a liquid resin is applied at least between the substrate and a chip of the plurality of chips to be laminated directly on the substrate, or between the plurality of chips to be adjacently laminated, and
   wherein the step of dividing comprises the steps of:
   cutting the plurality of chips with a first cutting width, and simultaneously therewith, forming a notch/groove in the substrate by cutting the substrate to a predetermined thickness thereof;
   providing an overmold resin for covering the plurality of sub-laminated structures laminated on the substrate and filling gaps between adjacent sub-laminated structures of the plurality of the sub-laminated structures and the notch/groove; and
   cutting the substrate and the overmold resin that fills the gaps between the adjacent sub-laminated structures of the plurality of the laminated structures and the notch/groove with a second cutting width that is smaller than the first cutting width.

* * * * *